United States Patent [19]

Zeilenga et al.

[11] Patent Number: 5,144,242

[45] Date of Patent: Sep. 1, 1992

[54] CONTINUALLY LOADABLE MICROCODE STORE FOR MRI CONTROL SEQUENCERS

[75] Inventors: Jack H. Zeilenga, San Francisco; John Hoenninger, III, Oakland, both of Calif.

[73] Assignee: The Regents of the Univeristy of California, Oakland, Calif.

[21] Appl. No.: 571,258

[22] Filed: Aug. 23, 1990

[51] Int. Cl.$^5$ ............................................. G01R 33/20
[52] U.S. Cl. .................................................... 324/312
[58] Field of Search ............... 324/300, 307, 309, 310, 324/311, 308, 312, 313, 314, 318, 322

[56] References Cited

U.S. PATENT DOCUMENTS

| | | | |
|---|---|---|---|
| 4,191,919 | 3/1980 | Haney et al. | 324/312 |
| 4,707,661 | 11/1987 | Hoenninger, III | 324/309 |
| 4,812,981 | 3/1989 | Chan et al. | 364/200 |
| 4,845,613 | 4/1989 | Netter et al. | 364/200 |
| 4,912,633 | 3/1990 | Schweizer et al. | 364/200 |

OTHER PUBLICATIONS

Clark, "Pulsed Nuclear Resonance Apparatus," *Review of Scientific Instruments*, No. 3, p. 316, Mar. 1964.
Dick, "A Pulse Programmer for High-Power Nuclear Resonance," 48 *Journal of Physics E: Scientific Instruments*, p. 1054, 1976.
Conway et al, "Circuit for A Digital Pulse Programmer," 48 *Rev. Sci. Instrum.*, No. 6, p. 656, Jun. 1977.
Caron, "A New Programmable Timer Designed for Pulsed NMR," 31 *Journal of Magnetic Resonance*, p. 357, 1978.
Case et al, "Versatile Pulse Sequence Generator for Pulse NMR," 35 *Journal of Magnetic Resonance*, p. 439, 1979.
Dart, "Highly Flexible Pulse Programmer for NMR Applications," 51 *Rev. Sci. Instrum.*, No. 2, p. 224, Feb. 1980.
Thomann et al, "Digital Pulse Programmer for An Electron-spin-resonance Computer-controlled Pulsed Spectrometer," 55 *Rev. Sci. Instrum.*, No. 3, p. 389, Mar. 1984.
Jensen et al, "A Universal Pulse Programmer for NMR Imaging," Proceedings for the Third Annual SMRM, p. 379, 1984.
Sidky et al, "State-machine Digital Pulse Generator," 59 *Rev. Sci. Instrum.*, No. 5, p. 806, May 1988.
Wachter et al, "Enhanced State-machine Pulse Programmer for Very-high-precision Pulse Programming," 59 *Rev. Sci. Instrum.*, No. 10, p. 2285, Oct. 1988.
FH. Al-Riahi, "Software-controlled Memory Duplication," 9*Microprocessors and Microsystems*, No. 1, Jan.-/Feb. 1985.

*Primary Examiner*—Michael J. Tokar
*Attorney, Agent, or Firm*—Nixon & Vanderhye

[57] ABSTRACT

A microcoded pulse sequencer for real time control of a nuclear magnetic resonance (NMR) magnetic resonance imaging (MRI) system includes a microcode store which is continually loadable. Microinstructions are loaded into a one portion of the store while the sequencer executes micro-instructions out of another portion of the store. Means are provided to ensure that the sequencer never executes micro-instructions currently being loaded, and also ensures (through timing features) that the sequencer can never, over time, execute micro-instructions more rapidly than new micro-instructions can be loaded (i.e., so that the sequencer never "runs out of" micro-instructions). Since the host processor and the microcode sequencer provide for continual loading of the sequencer store while the sequencer is running, the user/programmer may view the control store as an ideal virtual control store having an unlimited size. Programmers may now write NMR microcode sequences without concern for whether they will "fit" into the physical memory space provided by sequencer store. In addition, reloading of the control store is completely transparent to ongoing NMR pulse sequences in the preferred embodiment and causes no troublesome image-degrading interruption of such sequences.

21 Claims, 22 Drawing Sheets (START SEQUENCER)

(LOAD SEQUENCER, SEQUENCER NOT RUNNING)

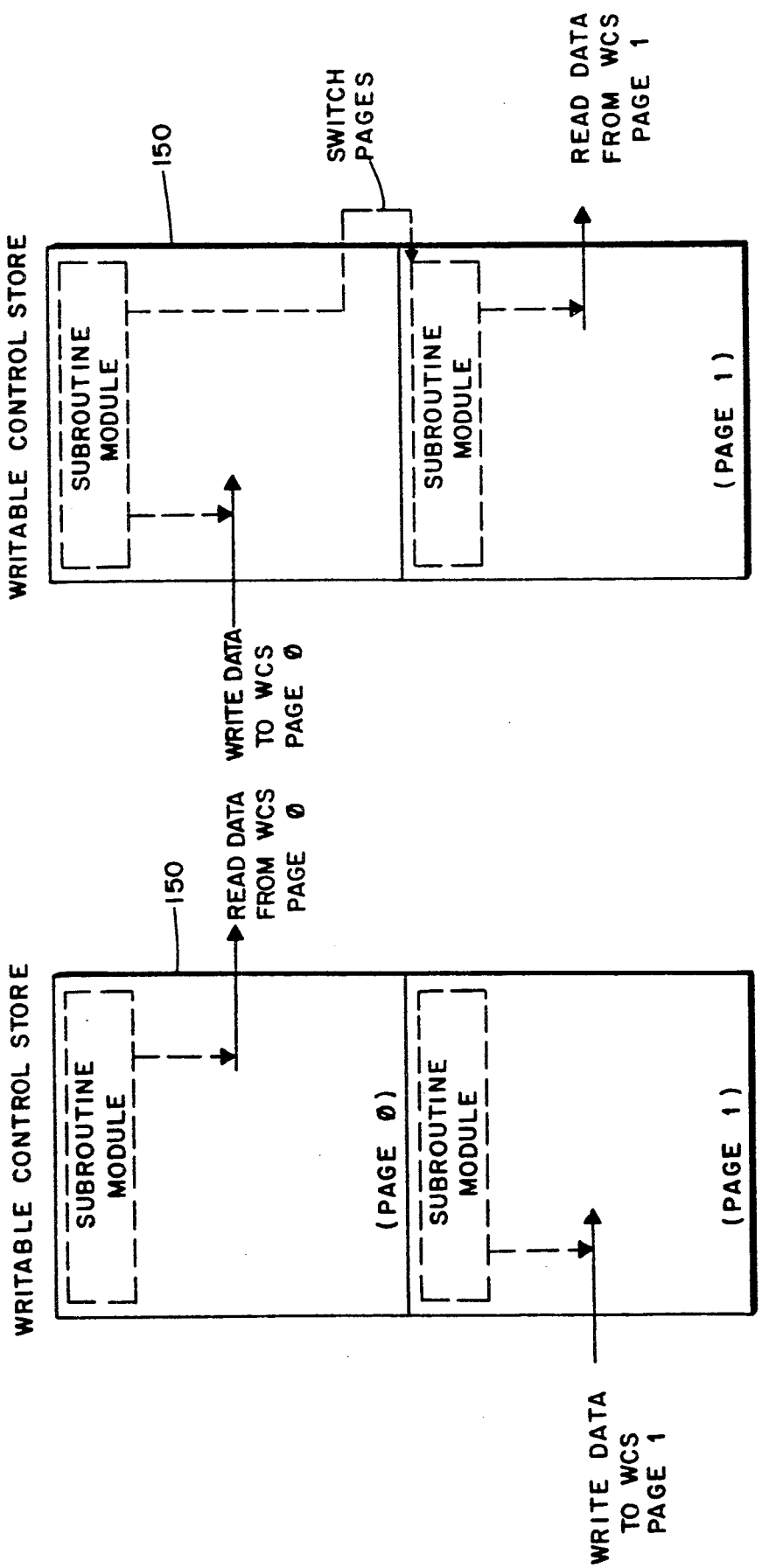

HOST PROCESSING ROUTINE

WRITABLE CONTROL STORE

WRITE TO SEQUENCER / SEQUENCER NOT RUNNING

WRITE TO SEQUENCER/SEQUENCER RUNNING

WRITE TO ACTIVE PAGE

CONTINUALLY LOADABLE MICROCODE STORE FOR MRI CONTROL SEQUENCERS

CROSS-REFERENCE TO RELATED PATENT APPLICATIONS

This patent application may be related to the following copending commonly-assigned patent applications:

U.S. Ser. No. 07/551,798 of Hoenninger filed Jul. 12, 1990 entitled "MAGNETIC RESONANCE IMAGING SEQUENCER GATING"

U.S. Ser. No. 07/579,631 of Hoenninger filed Sept. 11, 1990 entitled "FAST LINKER FOR AN NMR SEQUENCER"

FIELD OF THE INVENTION

This invention relates to nuclear magnetic resonance (NMR) techniques and more particularly to magnetic resonance imaging (MRI). Still more particularly, the present invention relates to microcoded pulse sequence generators (so-called "sequencers" or "pulse programmers") for MRI equipment. In more detail, the present invention relates to an arrangement for continual loading of the microcode store of such a microcoded MRI pulse sequence generator.

BACKGROUND AND SUMMARY OF THE INVENTION

The fundamentals of the MRI experiment are well known. Briefly (and hopefully without undue oversimplification), in a typical MRI system an object 10 (see FIG. 2) to be imaged (e.g., a portion of the human body) is placed in an external static magnetic field gradient. Protons within the object tend to align their spins in accordance with the magnetic field direction. The object is excited by one or more RF excitation pulses of appropriate frequency, timings and durations (as one example, so-called "spin-echo" type pulse sequences may be used). The RF excitation pulses generated at the Larmour frequency cause the protons to precess their spins. When each RF pulse is switched off, the nuclei precess back toward their equilibrium position and in this relaxation process emit an NMR response that can be detected by an RF receiver.

As is well known, different pulse sequences can be used to obtain different results. A pulse sequence generator (hereafter "sequencer") portion of the NMR system (e.g., often a high-speed hardware state machine based on a bit slice processor architecture) provides the sequence of control signals that controls the operation of the RF transmitter(s), RF receiver(s) and gradient magnet(s). The sequencer must reliably provide a high degree of flexibility (e.g., to provide generation of different desired pulse sequences) as well as adequate time resolution and other important features.

Briefly, a sequencer often comprises a microcoded sequential state machine, with each different state providing different output control signals to control different portions of the NMR equipment (e.g., RF transmitter and receiver, gradient coils, etc.). The "next state" to which the sequencer transitions is typically determined by the sequencer previous state. The time at which the transition occurs is generally variable (since different NMR equipment "states" last for different durations within a typical NMR pulse sequence) and may also be determined by the previous state. Different microcode may by loaded into a writable control store (WCS) within the sequencer to define different pulse sequences.

The following is a non-exhaustive listing of possibly representative prior patents and articles relating to NMR sequencers:

Hoenninger III U.S. Pat. No. 4,707,661 (1987);

Clark, "Pulsed Nuclear Resonance Apparatus," *Review of Scientific Instruments*, Vol 35, No 3, p316, March 1964;

Dick, "A Pulse Programmer for High-Power Nuclear Resonance," *Journal of Physics E: Scientific Instruments*, Vol 9, p1054, 1976;

Conway et al, "Circuit for A Digital Pulse Programmer," *Rev. Sci. Instrum.*, Vol 48, No 6, p656, June 1977;

Caron, "A New Programmable Timer Designed for Pulsed NMR," *Journal of Magnetic Resonance*, Vol 31, p357, 1978;

Case et al, "Versatile Pulse Sequence Generator for Pulse NMR," *Journal of Magnetic Resonance*, Vol 35, p439, 1979;

Dart, "Highly Flexible Pulse Programmer for NMR Applications," *Rev. Sci. Instrum.*, Vol 51. No 2, p224, February 1980;

Thomann et al, "Digital Pulse Programmer for An Electron-spin-resonance Computer-controlled Pulsed Spectrometer," *Rev. Sci. Instrum.*, Vol 55, No 3, p389, March 1984;

Jensen et al, "A Universal Pulse Programmer for NMR Imaging," Proceedings for the Third Annual SMRM, p379, 1984;

Sidky et al, "State-machine Digital Pulse Generator," *Rev. Sci. Instrum.*, Vol 59, No 5, p806, May 1988; and Wachter et al, "Enhanced State-machine Pulse Programmer for Very-high-precision Pulse Programming," *Rev. Sci. Instrum.*, Vol 59, No 10, p2285, October 1988.

The Hoenninger patent describes a microcoded sequencer having a 96-bit microcode format including an op code and associated branch address, a time duration, and various control fields. See also the Sidky et al, Caron et al, Wachter et al and Dart et al articles.

Such MRI microcoded sequencers generally include a writable control store (WCS) containing a sequence of microinstructions that define a corresponding sequence of machine states. The microinstructions are, in one sense, a computer program executed by the sequencer. This microcode computer program specifies sequencer outputs (e.g., to control portions of the MRI system such as the RF transmitter, the gradient coils, etc.) and also specifies the duration of such sequencer outputs. In addition, the microcode computer program specifies an ordered sequence of sequencer machine states—by providing a corresponding ordered "in line" sequence of microinstructions executed one after another in the order in which the microinstructions are stored in the control store and/or by providing conditional or unconditional "branching" microinstructions which cause particular microinstruction(s) to be performed in an order different from the order in which the microinstructions are stored in the control store.

Since the sequencer control store is writable (e.g., by a host computer linked to the sequencer), different NMR pulse sequences can be specified by simply downloading different microinstructions into the sequencer control store. Thus, different microinstruction sequences corresponding to hundreds of different NMR pulse sequences may be maintained on the host computer's mass storage (e.g., hard disk). Software executing on the host computer permits an operator to select (or create) particular sequencer microcode routines corresponding to particular experiments. The host computer then downloads the selected routines into the sequencer writable control store for execution by the sequencer. The host computer may download, along with the actual microcode routines, additional routines and data (e.g, commonly used subroutines, reference tables and the like) that must be present in the writable control store in order for the selected microcode routines to run.

A problem that has arisen in this type of microcoded sequencer arrangement relates to the size of the writable control store.

The microcode routines corresponding to many widely used simple NMR pulse sequences are relatively short and can easily be stored within a relatively small writable control store. Unfortunately, many useful experiments require more complex and lengthy NMR sequences—thus mandating much more lengthy microcode routines. It is not unusual for a single NMR experiment to require microcode routines having more than 32,000 microinstructions. There are also tendencies toward (a) increasing the width of the microinstructions (e.g., to on the order of 144 bits or more), and (b) increasing the time resolution of the sequencer (e.g., to on the order of 250 ns in order provide more precise control and timing parameters). These constraints require the sequencer writable control store to be extremely fast (e.g., on the order of 100 ns) and also very "wide". The width constraint forecloses the possibility of using standard memory chips in standard configurations, and instead requires multiple chips to be addressed in parallel in order to provide required widths. These various constraints together cause the memory and associated addressing components for the writable control store to represent a significant part of the cost of the NMR sequencer.

Thus, while recent significant advances in high density memory VLSI integrated circuits have allowed much larger memories to be used cost-effectively in many digital processing applications (such as general purpose digital computers), the critical timing and micro-instruction width constraints (as well as hardware complexity and reliability factors) imposed by modern NMR microcoded sequencer designs make it very important to keep the size of the sequencer writable control store relatively small.

Of course, memory paging and bank switching have long been used in general purpose digital computing environments to increase the effective size of a limited memory space.

Memory bank switching is commonly used to increase the effective size of a processor address space. See, for example, H. Al-Riahi, "Software-controlled Memory Duplication", 2407 *Microprocessors and Microsystems* No. 1, 9 (Jan/Feb. 1985) for an example of one such memory bank switching arrangement providing two alternate 64K memory banks and a capability to select between the two banks under software control. Such bank switching techniques do not solve the problems discussed above, however, since they do not reduce (and instead actually increase) the absolute amount of memory required.

Memory paging techniques do, however, serve to decrease the size of the memory required. "Page swapping" and associated "virtual storage" techniques were first devised in the 1960's in connection with the design of the some of the first multi-user operating systems. Virtual storage describes a technique wherein a particular user or application is assigned a much smaller portion of physical memory than he actually needs. The following is a simplified description of page swapping and virtual storage as implemented on a wide variety of computer systems since the 1960's.

Suppose, as a simple illustrative example, that a user compiles his application program to generate object code occupying 9K of memory but that the time-shared general purpose digital computer the user wishes to use to execute his program allocates the user only 4K of physical storage. The disparity between actual program size and allocated physical storage size is hidden from the user by page swapping services provided by the computer operating system. To run the user's 9K program, the operating system loads the first 4K (or less) of the user's program from mass storage into the limited physical memory block allocated to the user. The operating system causes the memory resident portion to be executed until a call is generated to an instruction not resident in memory. This call is intercepted by the operating system, which treats the call as a request for a page swap. The operating system "swaps" some or all of the memory resident code *out* of the physical memory allocated to the user and "swaps" *in* to physical memory a different portion of the user's object code containing the required instruction. Many such page swaps may be required before the program finishes executing—with the number of swaps needed depending upon the length of the program relative to the amount of physical memory available (and also upon the number and nature of internal branches within the program).

Page swapping, of course, represents a tradeoff between physical memory allocation and processing time. One of the problems with page swapping relates to the time and other processing overhead required to perform the swapping of pages into and out of memory. Much effort has been devoted to optimizing page swapping (e.g., by providing multiple smaller pages that can be swapped out independently, and by keeping memory resident certain sections of code that the operating system determines have a high probability of being needed).

Page swapping and virtual memory management thus permits large programs to be executed within much smaller physical memory spaces. Such page swapping techniques are provided in most modern multi-user systems, and have also become widely used in modern single-user systems such as personal computers and other microcomputers.

Prior art NMR systems were provided with an "on the fly" reloading technique somewhat analogous to page swapping. FIG. 1 is a graphical illustration in flowchart form of an exemplary prior art NMR system provided with such an "on the fly" writable control store reload capability. At block A (before the sequencer is started), the host computer loads the entire control store with micro-instructions. When the sequencer is started (blocks B and C), the sequencer repetitively reads from the control store and executes the micro-instructions stored within the store—thus generating NMR pulse sequences for a desired NMR experiment.

In many b useful NMR experiments, the sequencer might never (depending upon the size of the writable control store and the efficiency of the microcode) reach the end of the control store. However, in more complex experiments the sequencer will reach the end of the control store before the experiment has terminated ("Y" exit of decision block C) and require a micro-instruction that is not resident in the store. When the sequencer reaches the end of the control store, it suspends operations momentarily (block D) and requests the host to rewrite the control store (block E). The sequencer can be designed so that the host can very rapidly load the writable control store (e.g., using direct memory access (DMA) techniques). Rewriting the control store at block E may thus introduce only a few seconds of delay. Once the host has successfully rewritten the sequencer control store, the sequencer may resume operations at the beginning of the control store (or at some other predetermined transfer point) (block F). The writable control store can be reloaded as many times as necessary to cause the sequencer to execute the entire control program.

While the prior art technique shown in FIGURE 1 is successful in permitting NMR programmers to write microcode sequences longer than the writable control store, this technique also generates some significant problems in the real time control context of an NMR sequencer.

The regular RF stimulations provided during MRI imaging cause the NMR-sensitive molecules within the body being imaged to enter a dynamic steady state different from the unexcited steady state. If these regular stimulations are interrupted, relaxation causes the NMR-sensitive molecules to move away from the dynamic steady state toward their natural (unexcited) steady state. Interrupting the NMR pulse sequence to reload the writable control store interrupts the regular stimulations.

A technique known as "spin conditioning" has been used to stimulate the body back to dynamic steady state after such an interruption (and before data acquisition resumes). However, spin conditioning wastes time and may also not be entirely effective in avoiding image degradation caused by the interruption. This is due to the fact that the exponential time constants of the spins in some human body tissues are 1-2 seconds and spin conditioning is not usually performed for the 5-10 seconds required to return to steady state. There may also be eddy currents in the magnet with time constants in excess of 1 second. Since the time between reloads of the control store is constant in most cases, the disruption is periodic and the Fourier Transform of the resulting data is sensitive to this periodic perturbation of the data, resulting in image artifacts. A disruption near the zero phase encoding data acquisition will cause especially strong effects. Interruption due to control store loading should be avoided in order to prevent loss of steady state in the body which can lead to artifacts and noise in the acquired image data—and thus cause image degradation.

The present invention avoids such interruptions (and thus resulting image degradation) by providing a technique whereby the writable control store can be loaded while the sequencer is reading from the store.

Briefly, the present invention provides a microcoded sequencer for real time control of an NMR system, the sequencer including a control store which is "continually" loadable. Micro-instructions are loaded into a control store, and the sequencer executes micro-instructions out of this control store. Means are provided to ensure that the sequencer never executes micro-instructions from a section of the store currently being loaded, and also ensures (through timing features) that the sequencer can never, over time, execute micro-instructions more rapidly than new micro-instructions can be loaded (i.e., so that the sequencer never "runs out of" micro-instructions).

The present invention provides an arrangement wherein a host processor can access only (a) particular memory spaces of the control store (b) over particular time durations—with the particular memory spaces and the particular time durations each being specified (and limited) by the sequencer. The spatial limitation ensures that the sequencer never attempts to execute micro-instructions from a memory space within the control store that is currently being loaded by the host processor. The time limitation allows the same sequencer memory addressing and other hardware arrangements to be used by both the host processor and by the sequencer for control store access.

The spatial limitation feature described above is provided in the preferred embodiment by dividing the control store into two pages (both simultaneously within the sequencer address)—and by preventing the host processor from reloading the page storing micro-instructions the sequencer is currently executing. The sequencer is capable of executing only one micro-instruction at a time—and therefore can never execute micro-instructions from two pages simultaneously. The host processor may be appropriately programmed so that it never attempts to reload the page currently being accessed by the sequencer. The preferred embodiment sequencer design preferably includes spatial arbitration arrangements which sense an error condition whenever the host attempts to corrupt the page the sequencer is executing from.

In addition, the microcode is preferably organized such that each page contains all of the data, subroutines, and the like needed to execute each of the micro-instructions within that page. Thus, in the preferred embodiment, subroutines may preferably be loaded redundantly into each of the two pages so as to minimize branching between the two pages of the control store. In addition, the microcode is preferably generated to avoid recursion and iteration over page boundaries (e.g., by converting iterative routines larger than a single page into "in-line" code for loading into successive pages). A virtual sequencer control store of infinite length may thus be provided using a relatively small (e.g., 32K micro-instructions long) physical control store.

The reload timing considerations mentioned above are perhaps unique to the real time NMR experiment control functions performed by an NMR microcoded pulse sequencer. Unlike in most other contexts and environments, the short micro-instruction cycle times provided by an NMR pulse sequencer are not generally taken advantage of to provide higher micro-instruction throughput. Because of this special and unusual feature of the NMR system, leftover time between the end of a sequencer micro-instruction cycle for a particular micro-instruction and the end of the machine state caused by that micro-instruction is often considerable (e.g., on the order of milliseconds). In accordance with one important aspect of the present invention, this leftover time is used to reload the sequencer control store.

In somewhat more detail, the point in time at which a micro-instruction is executed by an NMR pulse sequencer determines the beginning of an associated NMR output state. The accuracy of the NMR experiment often critically depends upon when such output states begin with respect to one another. It is therefore highly desirable to provide an extremely short minimum micro-instruction cycle time (e.g., on the order of 250 ns)—and thus to provide sufficiently precise time resolution specifying the points in time when the NMR system is to transition to a new output state. This micro-instruction cycle time is typically far too short to subdivide into different time slices reserved for memory access by the sequencer and by the downloading host processor, respectively—and in the preferred embodiment such time divisions of a single micro-instruction cycle minimum duration are avoided entirely.

However, unlike most general purpose digital computers (in which instruction cycle times are almost always on the same order as machine state durations), the duration of a typical state of a microcoded NMR sequencer is typically much longer than, for example, a 250 ns minimum micro-instruction cycle duration. For example, the exemplary preferred embodiment sequencer is capable of encoding a state duration of up to eight seconds —with a begin/end time resolution of 250 ns. Typical NMR sequencer state durations will be on the order of milliseconds or tenths of seconds, and state durations on the same order as micro-instruction cycle durations will be programmed only rarely.

In the preferred embodiment, the sequencer memory cycle time is much faster than the host bus cycle time. The preferred embodiment takes advantage of this sequencer speed advantage by permitting the host processor to address and write directly into the sequencer control store with no significant buffering (thus reducing hardware cost and complexity). If the host processor attempts to write into the sequencer control store during a time period in which the sequencer also needs access, the sequencer takes priority and causes the host processor to wait (in the preferred embodiment, this host processor "wait" simply causes the host processor bus cycle time to be extended).

It is possible that the sequencer may execute a series of single clock cycle state changes—thus preventing the host bus cycle from completing (i.e., causing the host processor bus cycle to exceed a certain maximum time and thus "time out"). In the preferred embodiment, the sequencer micro-instruction cycle time is 250 ns and the host processor (DIGITAL, INC. Q22) bus timeout period is 10 ns. There can thus be 39 successive 250 ns duration sequencer micro-instructions in the preferred exemplary implementation before the host processor bus times out. Very few such 250 ns micro-instructions are consecutively executed during normal NMR pulse sequence generation, so this is not a problem encountered in normal system operation.

Moreover, in accordance with the preferred embodiment of the present invention, the sequencer performs most or all of the processing for a micro-instruction within the first 250 ns after a state transition occurs. If the state duration selected by the processed micro-instruction is only 250 ns long (as it will be occasionally during normal operation), the sequencer changes to the next state at the end of the 250 ns minimum micro-instruction cycle time—leaving no "leftover" time for reloading the control store. However, if the state duration specified by the processed micro-instruction is longer than the 250 ns minimum cycle time, the sequencer permits the host processor to access and reload the control store for the remainder of the state duration (until just immediately prior to state termination).

And in the preferred embodiment, a host-to-sequencer write can be completed within a single sequencer (minimum) micro-instruction cycle time (i.e., 250 ns)—so that a write that has begun is always guaranteed to end prior to the time the sequencer must next change states. Moreover, this rapid completion of a host data write cycle in the preferred embodiment prevents host bus timeout from occurring whenever there is even a single "free" sequencer micro-instruction cycle during the host bus timeout period.

Thus, it is *possible* over a short time for successive short machine states to occur such that the host is prevented from reloading the control store more rapidly than the sequencer executes micro-instructions from the store. However, this situation is highly unlikely to exist for a significant time period during actual operation of the NMR system due to the relatively long durations of useful NMR pulse output sequences and associated sequencer states. Because the nature of the NMR experiment constrains the preferred embodiment pulse sequencer to always process micro-instructions far less rapidly than it is actually capable of processing them, the average sequencer state duration far exceeds the average time it takes for the host to reload a micro-instruction—and thus there is always enough time left over during practical NMR system operation to reload the control store with micro-instructions before the sequencer "runs out of" micro-instructions to execute.

The loading of the sequencer microcode control store when the sequencer is running in accordance with the present invention ensures that the sequencer outputs are not interrupted even though the control store is not large enough to store all of the microcode needed to execute an MRI sequence. There are other advantages provided by continuous loading, including reduction of latency between the issue of a sequence "link and load" command to the host processor and the actual beginning of execution (since only a small portion of the microcode needs to be linked and loaded before the sequencer can be started).

Since the preferred embodiment host processor and the microcode sequencer provide for continual loading of the sequencer control store while the sequencer is running, the user/programmer may view the control store as an ideal virtual control store having an unlimited size. Programmers may now write NMR microcode sequences without concern for whether they will "fit" into the physical memory space provided by the NMR sequencer control store. In addition, reloading of the control store is completely transparent to ongoing NMR pulse sequences in the preferred embodiment and causes no troublesome interruption of such sequences.

BRIEF DESCRIPTION OF THE DRAWINGS

These and other features and advantages of the present invention may be better and more completely understood by referring to the following detailed description of a presently preferred exemplary embodiment in conjunction with the drawings, of which:

FIGS. 3A-3D are schematic illustrations of the sequencer control store continuous loading operation performed by the FIG. 2 preferred embodiment;

DETAILED DESCRIPTION OF PRESENTLY PREFERRED EXEMPLARY EMBODIMENTS

The overall architecture of a preferred embodiment NMR system 100 will first be described in conjunction with FIG. 2. Then, a high level description of sequence of host computer and microcoded sequencer operations used to provide continual loadability of the sequencer control store will be discussed in conjunction with FIGS. 3A-3D and 4. Following such discussion, a more detailed description of the presently preferred exemplary microcoded sequencer design will be presented in conjunction with FIGS. 5-13. Finally, a description of the operation of the sequencer shown in FIGS. 5-13 will be presented in conjunction with FIGS. 14-16.

I. Overall NMR System 100

Figure 1:
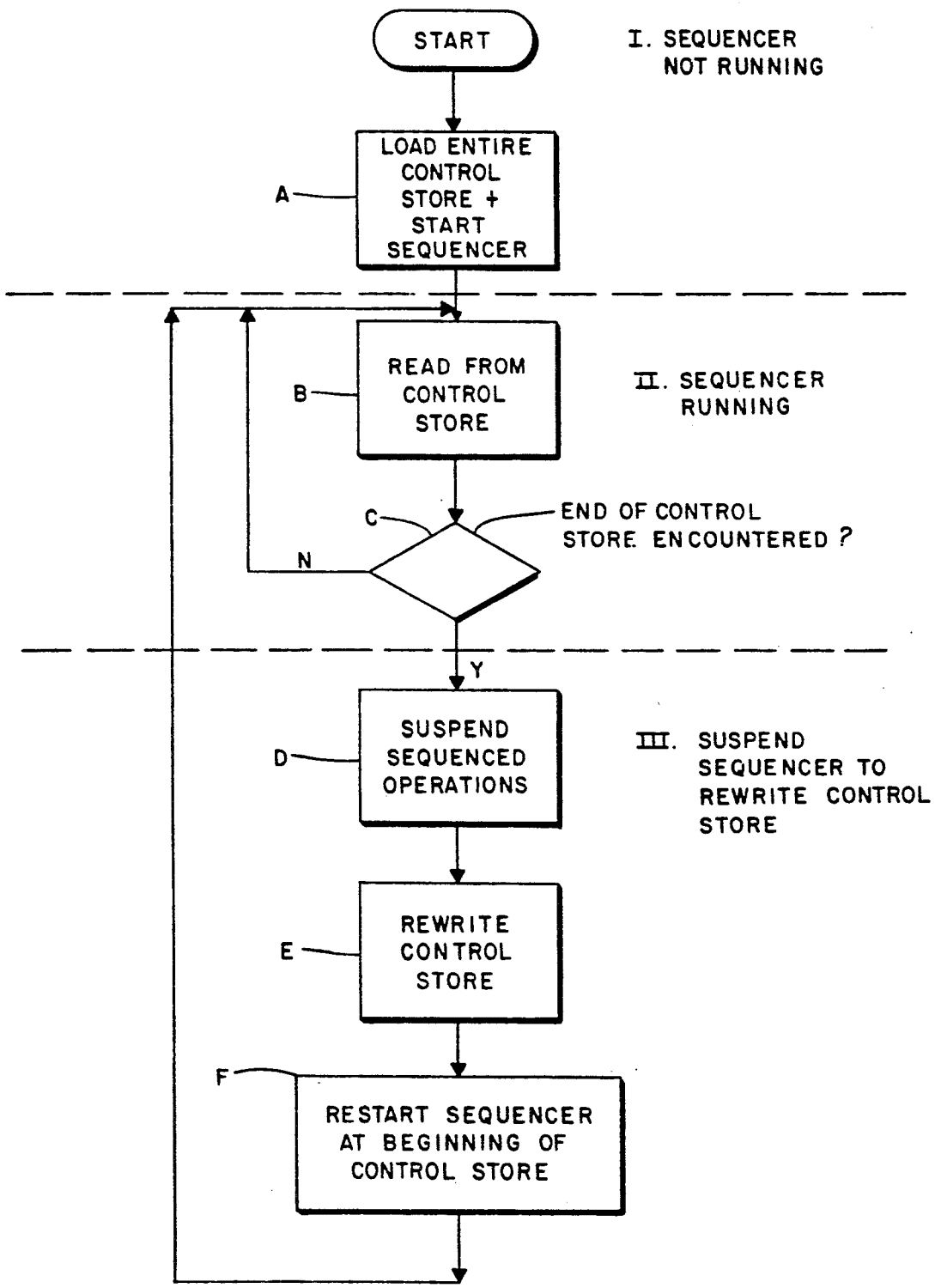
FIG. 1 is a schematic diagram in flowchart form of the microcode reload operation performed by an exemplary prior art NMR microcoded pulse sequencer.
Figure 2:
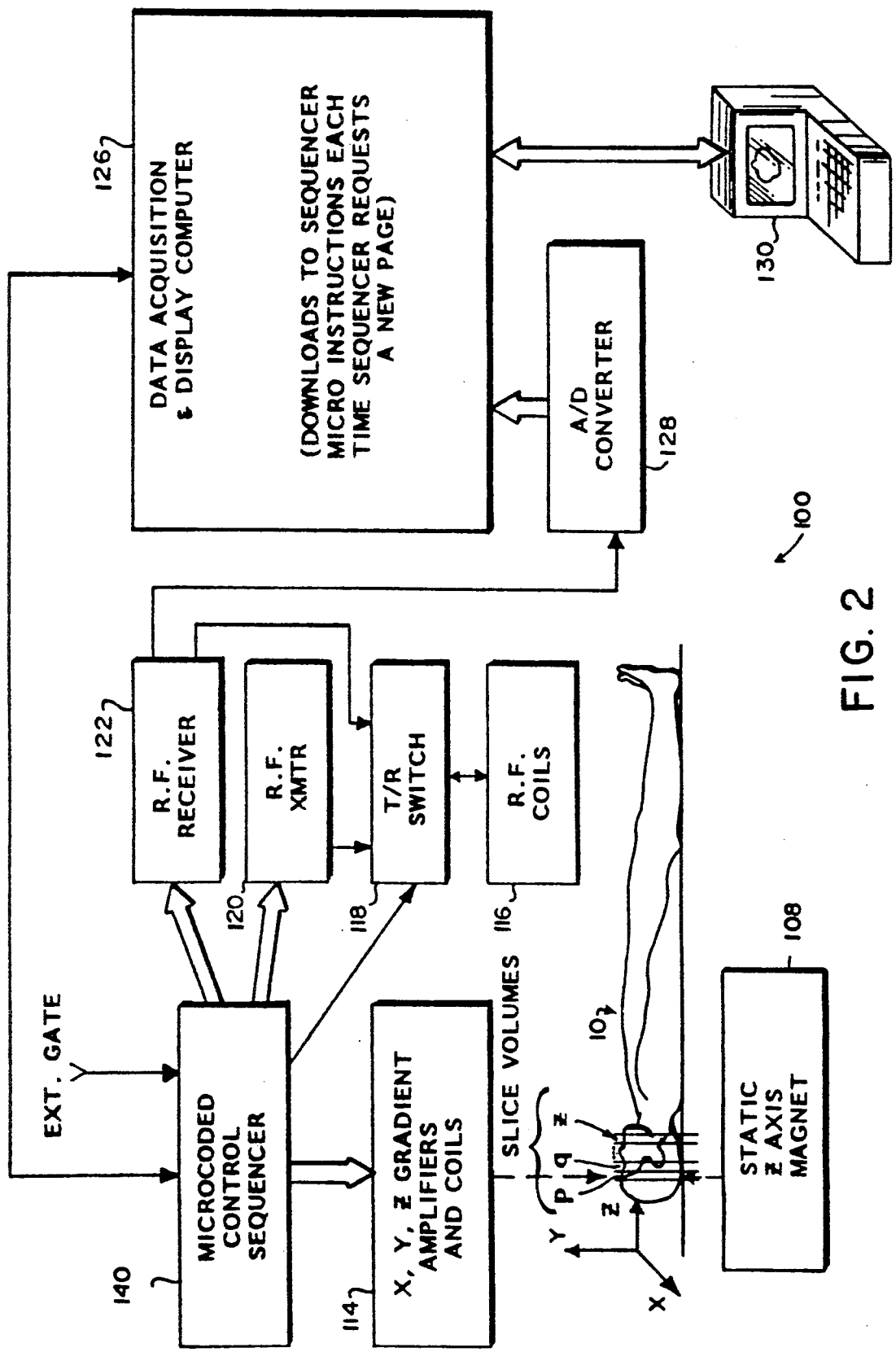
FIG. 2 is a high level block diagram of a presently preferred exemplary embodiment of an NMR system including a control sequencer with a writable control store provided by the present invention.

The block diagram of FIG. 2 depicts the general architecture of an exemplary preferred NMR imaging system 100 of the type with which the microcode sequencer with continually loadable microcode store in accordance with the present invention may be used.

Typically, a human or animal subject (or any other object to be imaged) 10 is placed within a static magnetic field. For example, the subject may lie along the z-azis of a static magnet 108 which establishes a substantially uniform magnetic field directed along the z-azis within the portion of the object 10 of interest. For example, contiguous parallel slice-volumes p,q ... z may be located within the volume to be imaged. Gradients (e.g., a fixed weak z gradient) may be imposed within this z-axis directed magnetic field along mutually orthogonal x,y,z axes by a set of x,y,z gradient amplifiers and coils 114 to phase encode the resulting NMR response signals which are generally then read out with the gradients turned off. NMR RF signals are transmitted into the object 10 and NMR RF responses are received from the object via RF coils 116 connected by a conventional transmit/receive switch 118 to an RF transmitter 120 and RF receiver 122. As will be appreciated by those in the art, separate transmit and receive coils may be used in some installations, in which case the T/R switch 118 may not be needed.

All of the prior mentioned elements may be controlled, for example, by a microcoded control sequencer 140 which communicates with a data acquisition and display computer (hereafter "host processor") 126. The latter host processor 126 may also receive NMR responses via an analog-to-digital converter 128.

A CRT display and keyboard unit (terminal) 130 is typically also associated with the host processor 126.

As will be apparent to those in the art, such an arrangement may be utilized to generate desired sequences of magnetic gradient pulses and NMR RF pulses and to measure the desired NMR RF responses in accordance with stored computer programs.

In particular, host processor 126 maintains, on mass storage, a library of microcode routines corresponding to useful NMR pulse sequences. An operator may select (and also edit or otherwise manipulate) desired microcode routines from the library via terminal 130, and then command host processor 126 to download such microcode routines into sequencer 140 for execution by system 100. The sequencer 140 controls, in real time, the gradient amplifiers and coils 114, the RF receiver 122 and the RF transmitter 120, so as to cause NMR pulse sequences to be generated. Host computer 122 receives the digitized RF NMR responses (via A/D converter 128) and processes those digitized responses (e.g., via image reconstruction and other conventional techniques) so as to provide, on terminal 130 (or other display), one or more images corresponding to body 10.

II. Continual Loadability of Sequencer Microcode Control Store

Figure 3B:
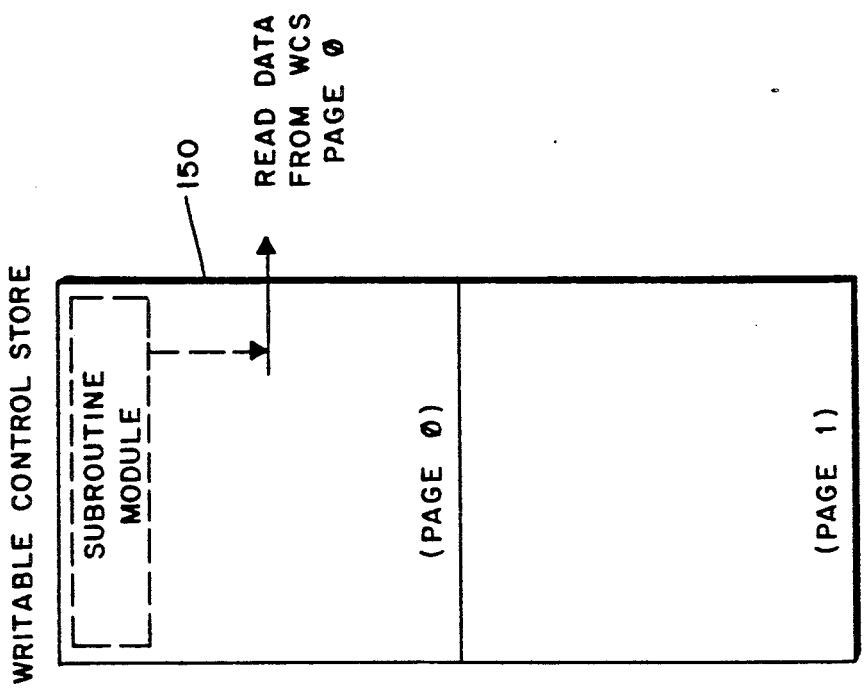
Figure 3A:
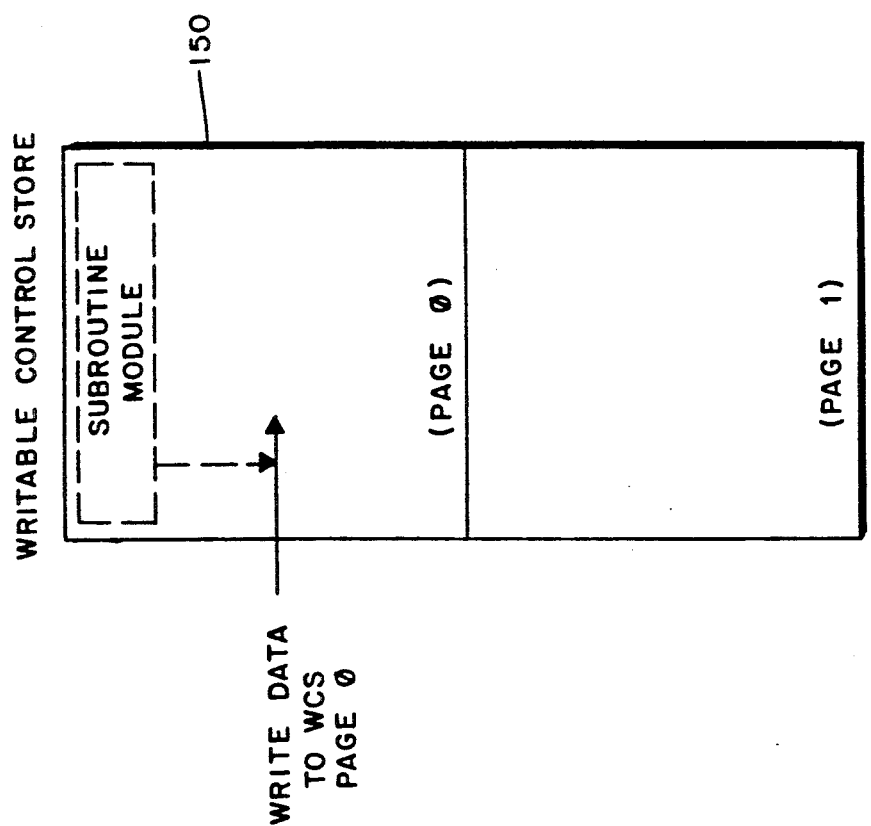
Figure 4:
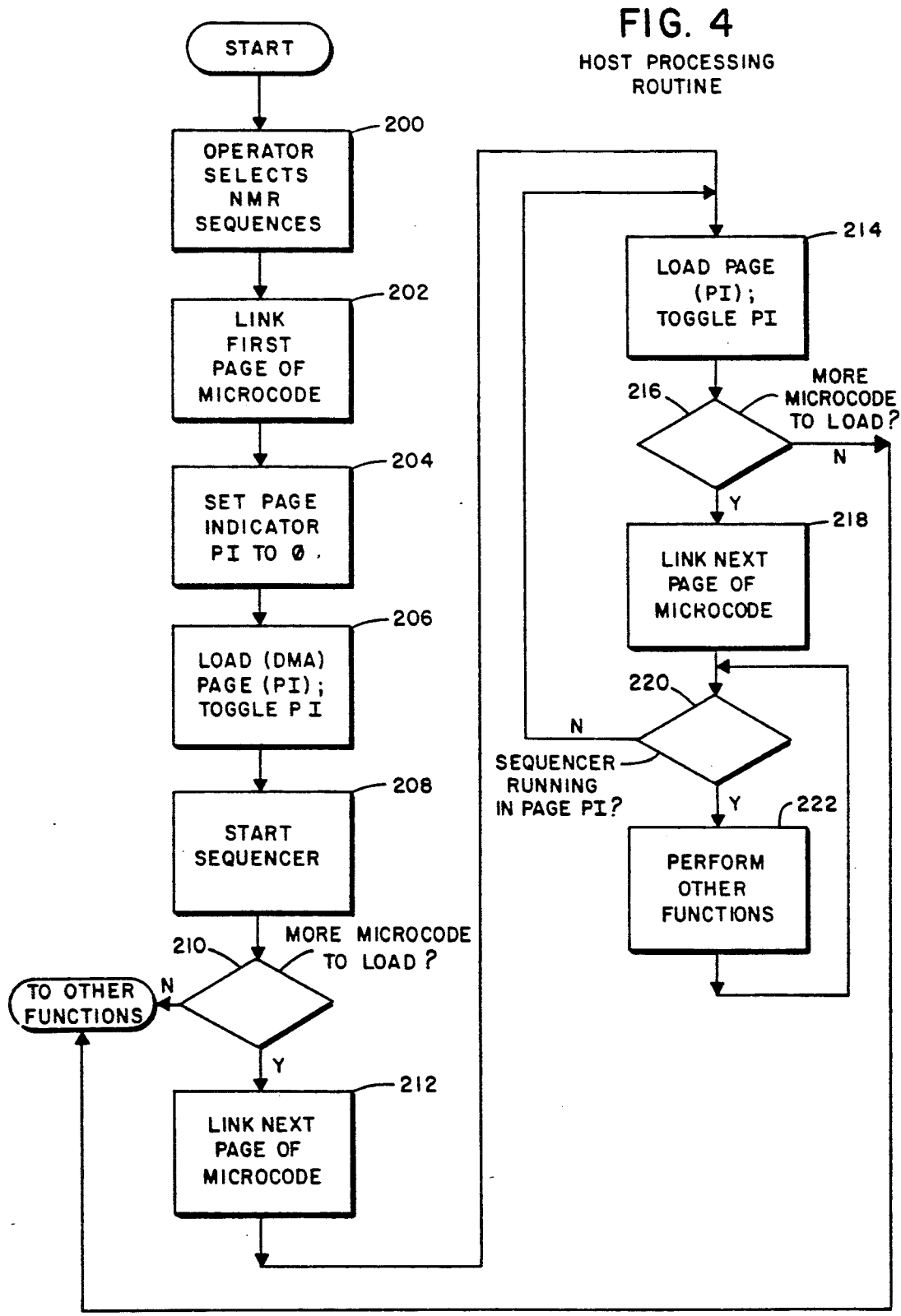
FIG. 4 is a schematic flowchart of exemplary program control steps performed by the host processor shown in FIG. 2.

FIGS. 3A-3D are a sequence of schematic block diagrams which graphically illustrate the continual loading of an exemplary writable control store (WCS) 150 portion of the FIG. 2 sequencer 140, and FIG. 4 is a schematic diagram in flowchart form of exemplary program control steps performed by the FIG. 2 host processor 126 in cooperation with sequencer 140 so as to provide such continual loading.

Referring to FIGS. 3A and 4 together, a human operator first selects the particular NMR pulse sequences to be performed by system 100 (e.g., by interacting with a menu driven software selection routine via terminal 130) (FIG. 4, block 200). In response to such selections, host computer 126 retrieves one or more corresponding microcode routines and subroutines from mass storage and also retrieves tables and other data/routines required for execution of the retrieved routines. When the human operator requests system 100 to execute the selected microcode routines, host processor 126 links the initial routine(s) and subroutine(s) with tables, etc.—continuing this linking process until a first page (16K micro-instructions long or less in the preferred embodiment) of microcode has been generated (FIG. 4, block 202). See copending commonly-assigned application Ser. No. 07/579,631 filed Sept. 11, 1990 entitled "Fast Linker For An MRI Sequencer" for additional details regarding this assembly/linking process. Host processor 126 then sets a page indicator pointer (PI) to indicate sequencer control store Page 0 (for example) (block 204) and downloads this first page worth of microcode (including the associated subroutines, etc.) into WCS 150 Page 0 using direct memory access (DMA) techniques (block 206; see FIG. 3A). Host processor 126 loads the micro-instructions into page 0 sequentially in ascending address order in the preferred embodiment (with the subroutine segment of microcode being written into the bottom of the page)—with page indicator PI corresponding to the most significant bit (MSB) of the memory addresses applied by the host processor to the sequencer.

In the preferred embodiment, the last executable micro-instruction the host processor 126 loads into either page of WCS is always either a JUMP microinstruction to the first executable micro-instruction within the other page; or a STOP micro-instruction. Thus, the last micro-instruction the host processor loads into WCS 150 Page 0 is a branch to an as yet uninitialized location within WCS Page 1 (and in general, such JUMP page transfer micro-instructions will point initially to locations within the other page of WCS that do not contain proper target micro-instructions for the JUMP at the time the page transfer micro-instruction is loaded). The assumption is made in the preferred embodiment that by the time the sequencer 140 executes the JUMP micro-instruction, host processor 126 will have not only written the proper micro-instruction into the location that is the JUMP micro-instruction target—but will actually have written the entirety of the other page of WCS 150.

Note that in the preferred embodiment, this page transfer JUMP micro-instruction appearing as the last executable micro-instruction with the page is typically the only page transfer micro-instruction stored within the page. While it is generally possible to jump more freely between pages, special precautions must be taken to ensure that host processor 126 does not corrupt a page that is currently being accessed by the sequencer 140. In the preferred embodiment, the host processor 126 is never allowed to write into the page of WCS 150 that is being read by sequencer 140.

Once host processor 126 loads Page 0 of WCS 150, it toggles its page indicator PI to indicate Page 1 (FIG. 4, block 214) and then starts sequencer 140 (FIG. 4, block 208). Sequencer 140 begins executing micro-instructions from Page 0 of WCS 150, with WCS Page 1 still being empty at this point (see FIG. 3B).

Host processor 126 then determines whether there is further microcode to be executed by sequencer 140 that has not yet been loaded into WSC 150 (FIG. 4, decision block 210). If there is no more microcode, the host processor 126 is finished loading the sequencer 140 and can perform other functions and processes ("N" exit of decision block 210, FIG. 4). Typically, however, there will be additional microcode to load ("Y" exit of decision block 210, FIG. 4) and host processor 126 will proceed to link the next portion of microcode (including a further standard or customized subroutine/table load module required for this next portion of microcode to run) until a further page worth of microcode has been generated (FIG. 4, block 212). Since WCS 150 Page 1 is empty at this point, host processor 126 immediately begins loading this generated next page worth of microcode into WCS Page 1 using DMA techniques (FIG. 4, block 214).

FIG. 3C depicts schematically the situation existing at this point in time—with sequencer 150 reading microinstructions from Page 0 and host processor 126 writing micro-instructions to Page 1. Sequencer 140 in the preferred embodiment time multiplexes access to WCS 150 so that the sequencer and host processor 126 never simultaneously access the WCS (and thus, common memory addressing and other circuitry can be used for both sequencer and host processor memory accesses). As discussed above, even though sequencer 140 is two orders of magnitude faster than host processor 126, the time durations of normal NMR output states all but guarantee that host processor 126 will finish writing WCS 150 Page 1 before sequencer 140 finishes reading from WCS Page 0.

After host processor 126 finishes loading WCS Page 1, it toggles the page indicator (PI) to point to WSC Page 0 (block 214, FIG. 4) and then determines if there is still more microcode to load (decision block 216, FIG. 4). If there is, host processor 216 may immediately link the next page worth of microcode in order to prepare ahead of time to load the next page of WCS 150 (or if the linker is fast enough, linking and loading can be carried out simultaneously at block 214) (block 218, FIG. 4).

Host processor 126 does not attempt to access WCS 150 Page 0 until sequencer 140 indicates (e.g., by changing a status bit) that it has finished with Page 0 and is now reading from Page 1. Host processor 126 examines a status bit periodically and performs other functions (block 222, FIG. 4) while waiting for sequencer 140 to finish with the current page.

When sequencer 140 reaches the end of the microcode routines loaded within WCS 150 Page 0, it executes the JUMP (mentioned earlier) to the first executable micro-instruction stored within WCS Page 1. When the host reads the sequencer command and status register (CSR) and the CSR indicates that the sequencer has moved on to WCS 150 Page 1 (as tested for by decision block 220, FIG. 4), host processor 126 loads microcode routines (linked together with subroutines and tables to execute within a single page) into WCS 150 Page 0 (FIG. 4, block 214). This situation is depicted in FIG. 3D —which shows host processor 126 writing to WCS 150 Page 0 while sequencer 140 reads from WCS Page 1.

Once host processor 126 finishes writing to Page 0, it toggles PI again (FIG. 4 block 214), determines if there is more microcode to load (FIG. 4 decision block 216) and repeats blocks 218, 220, 222, 214 and 216 if there is more microcode to load. The sequence of WCS 150 events thus alternate between FIG. 3C and FIG. 3D as many times as is necessary to load and run all of the microcode for the selected NMR sequence.

Because host processor 126 and sequencer 140 provide for continual loading of WCS 150 while sequencer 140 is running, the user/programmer may view WCS 150 as an ideal virtual control store having an unlimited size. Programmers may now write NMR microcode sequences without concern for whether they will "fit" into the physical memory space provided by WCS 150. In addition, reloading of WCS 150 is completely transparent to ongoing NMR pulse sequences and causes no troublesome interruption of such sequences.

III. Detailed Description of Sequencer Architecture

Figure 5:
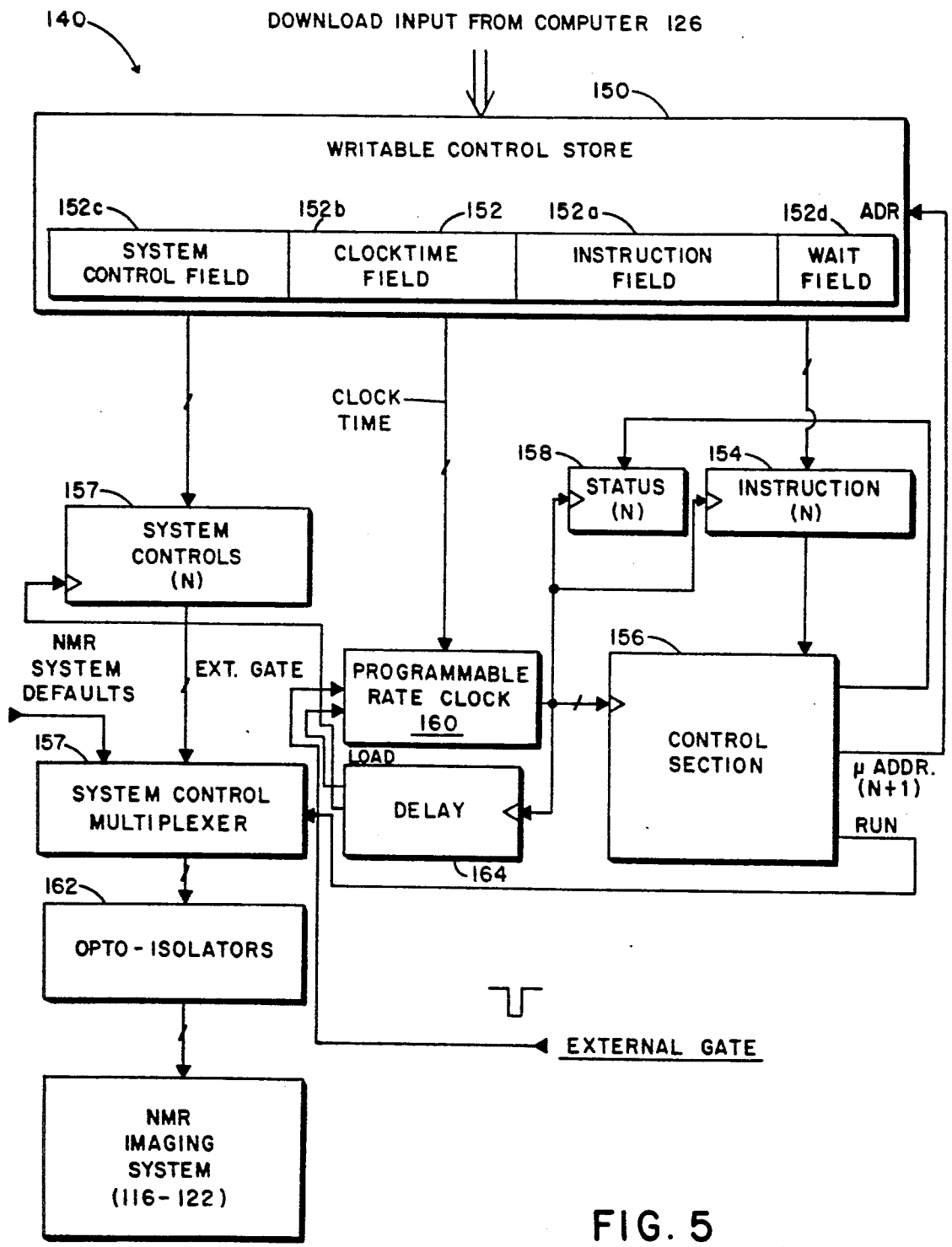
FIG. 5 is a high level schematic block diagram of the preferred embodiment sequencer shown in FIG. 2.

FIG. 5 is a high level block diagram of the architecture of the sequencer 140 shown in FIG. 2 in accordance with an exemplary embodiment in accordance with the present invention. This FIGURE 3 design is based on a conventional pipelined bit-slice CPU architecture but includes some significant enhancements which optimize the architecture for NMR pulse sequencing.

Sequencer 140 shown in FIG. 3 (which may be characterized as a state machine) includes a writable control store ("WCS") 150, a pipeline register (154,157,158), a control section 156, a system control multiplexer 157, and a programmable rate clock 160.

Control store 150 in the preferred embodiment includes a random access memory (RAM) the contents of which can be continually loaded by host processor 126 so as to contain a desired microprogram.

Exemplary micro-instructions each occupy the entire width of the WCS 150 at a corresponding address. The micro-instructions (an exemplary abbreviated format for which is shown at 152) each include an instruction field 152a, a clock time field 152b, and a system control field 152c and a WAIT field 152d.

The micro-instruction field 152a preferably contains an operational code or equivalent that controls state branching by the sequencer. For example, micro-instruction field 152a may contain a branch "op code" (e.g., "continue," unconditional jump, or conditional jump) and associated relative or absolute address information specifying a branch address of WCS 150 to branch to.

This micro-instruction field 152a is latched by pipeline register 154, which is composed of an input latch and output register. Pipeline register 154, 157 and 158 hold the current sequencer state N. The next state is addressed by the control section 156 as soon as possible after the state transition to state N if the duration of N is 250 ns. State N+1 is present at the output of the writable control store 150 within 250 nsec. If state N has a duration of only 250 nsec, then the pipeline register is loaded with state N+1 immediately due to an output from programmable rate clock 160. If state N lasts longer than 250 nsec., then the pipeline output register is not loaded immediately.

At the end of a state (N) in the preferred embodiment sequencer 140, a state change is initiated to cause the new current (N+1th) instruction field 152a to be stored within pipeline instruction register 154. The control section 156 then addresses a next (N+2) micro-instruction stored within WCS 150 immediately if the duration of the new current instruction is 250 ns. Control section 156 decodes the instruction contained within register 154 at the end of state N+1 and generates the address of a next (N+2) micro-instruction to be fetched. Control section 156 applies the address to WCS 150 to immediately fetch the next (N+2) micro-instruction. The next micro-instruction (N+2) is thus available at the output of WCS 150 and is latched by pipeline register 154 after the now-current state (N+1) ends.

The different fields 152a-d of the (N+1th) instruction are applied to different portions of the sequencer 140. For example, the system control field 152c is applied to system control multiplexer 157 so as to control various portions of the imaging system 116-122; the clock time field 152b is latched into programmable rate clock 160; and the WAIT field 152d is latched into control section 156.

The system control field 152c of micro-instruction format 152 contains control information for controlling various aspects of NMR system 100. System control multiplexer 157 selects, during periods of inactivity, NMR system default signals to prevent damage to the system and otherwise selects output signals provided by the current micro-instruction. The selected output signals are applied (via opto-isolators 162) to control various aspects of the NMR system (e.g., RF pulse ON/OFF state and RF frequency, the magnitudes of X, Y and Z magnetic field gradients, etc.).

In performing an NMR pulse sequence, speeds on the order of those needed in CPUs are almost never encountered. However, sequencer 140 must be capable of producing highly repeatable and simultaneous sequences of a large number of multi-bit control fields at highly precise timings. The timing resolution is especially critical (e.g., a resolution of on the order of 250 ns is desirable) and timing must also be adjustable over a wide range (e.g., 250 ns to 8 seconds). In the design shown in FIG. 5, these timing requirements are met by storing in each instruction a 15-bit clock time (within field 152b) along with a single bit scaler select value. The contents of clock time field 152b are applied to control programmable rate clock block 160, which in turn provides timing signals to control the timing of control section 156 and other portions of sequencer 140. Programmable rate clock block 160 very precisely times a delay having a duration responsive to the contents of clock time field 152b, this time delay controlling the duration of the current state (corresponding to the current —that is, the Nth—instruction).

In order to permit the micro-instruction clock time field 152b to contain timing information associated with execution of the (current) instruction in which the field appears, it is necessary to load programmable clock block 160 and system control block 157 for the next instruction N+1 a short delay time after control section 156 generates micro-address N+1. Registers 154, 156 delay the instruction field 152a and the status information for the current (Nth) instruction until the programmable rate clock block 160 processes clock time field 152b for the current instruction. A delay block 164 introduces a suitable delay for loading programmable rate clock 160 with the contents of clock time field 152b to ensure that the programmable rate clock is loaded a short delay time after the next state micro-address (N+1) is generated by control section 156.

In the preferred embodiment (as will be understood), micro-instruction sequences typically include micro-instructions of various different types. Most micro-instructions will have an instruction field corresponding to "CONTINUE," and will include a system control field 152c specifying the control states of the various portions of the NMR system (e.g., RF transmitter on/off, gradient magnet intensities, etc.) and a clock time field 152b specifying the duration of that sequencer state (i.e., how long the NMR system is to maintain the particular control settings specified by control field 152c). Some micro-instructions may specify a conditional or unconditional branch to another micro-instruction, and some may specify a WAIT (externally gated) state.

Figure 6:
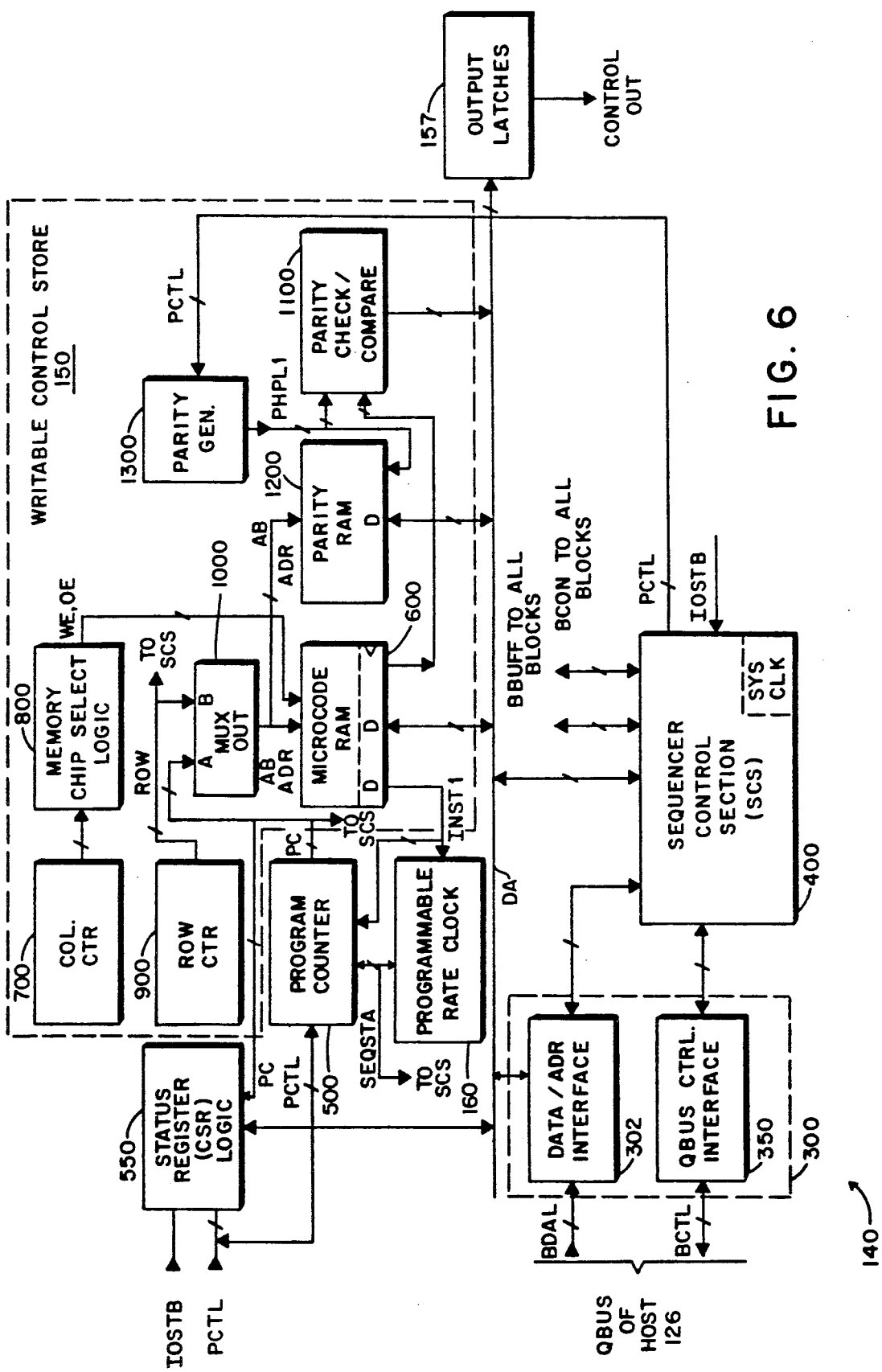
FIG. 6 is a more detailed schematic block diagram of relevant portions of the architecture of the FIG. 5 sequencer.

FIG. 6 is block diagram of the portions of an overall, exemplary preferred architecture of sequencer 140 shown in FIG. 5 relevant to loading and other access to the sequencer microcode writable control store (WCS) 150. Sequencer 140 as shown in FIG. 6 includes WCS 150, a host bus interface 300, a control section 400, programmable rate clock 160, a program counter 500, output latches 157, and a read status logic block 550. Various internal busses (including an internal multiplexed data/address bus DA, an internal control bus BCON, and a further internal bus BBUF) provide data, control and other signal paths between the various components of sequencer 140.

Sequencer 140 interfaces with the peripheral bus of host processor 126 via host bus interface 300. In the preferred embodiment, host processor 126 is a VAX general purpose digital computer manufactured by Digital Equipment Corporation (DEC), Maynard, Mass., and the host bus configuration and protocol correspond to the "Q22" QBUS standards promulgated by DEC. Host bus interface 300 provides an interface for this conventional Q bus, including an address/data interface 302 and a control signal interface 350. Host bus interface 300 communicates principally with sequencer control section 400, although it also has direct access to data/address bus DA and also to internal busses BCON and BBUF (since most or all of the blocks shown in FIG. 6 have direct access to BCON and BBUF, interconnections between these internal busses and individual blocks have been omitted to simplify the FIGURE).

The host processor 126 QBUS is a conventional 16-bit multiplexed data/address bus exhibiting a 10 μs timeout, and communicates with its peripherals using standard DEC signalling protocol. As those skilled in the art well know, detailed information about the structure, operation and protocols of this QBUS may be found in standard publications of DEC. Briefly, host processor 126 writes to sequencer by asserting a write control signal along with a 16-bit address within the sequencer memory space; and then by asserting data to be written to the specified sequencer memory location. The host processor 126 will continue to assert the data until either, (a) the bus times out (10 μs later), or (b) the sequencer asserts an acknowledgement signal "BRPLY" —at which time the host bus cycle terminates. Sequencer 140 communicates with host processor 126 (and receives data for loading into WCS 150) via this QBUS using standard DEC protocol.

As will be explained in more detail shortly, if the host attempts to write to WCS 150 at the same time that sequencer 140 needs to read from the WCS, the sequencer simply extends the host bus cycle (i.e., by waiting until the data has been written before asserting the acknowledgement signal). Thus, in the preferred embodiment there is no need to buffer much data from the QBUS; rather, each word of data from the QBUS is simply latched (by a single word latch in the preferred embodiment) and Written directly into WCS 150 at a time selected by the sequencer control section 400. Sequencer 140, in the preferred embodiment, extends the host bus cycle until the write has actually been completed by delaying transmission of the acknowledge signal protocol required for the host bus cycle to complete.

Sequencer control section (SCS) 400 in the preferred embodiment provides synchronization and control signals for the remainder of sequencer 140. There is a very close degree of interaction between SCS 400 and each of the other blocks of sequencer 140 such that individual control signals (not shown in FIG. 6) flow directly between each of the other functional blocks and the SCS. In addition, the preferred embodiment sequencer architecture includes internal busses BCON and BBUF providing control signal paths between the SCS 400 and the various other functional blocks of the sequencer 140. One of the blocks intimately coupled to SCS 400 is a 15-bit auto-increment program (location) counter 500 that applies addresses to WCS 150 specifying locations containing micro-instructions to be executed by sequencer 140 (with the most significant bit A14 of the program counter address selecting between pages of WCS 150 in the preferred embodiment). Program counter 500 is incremented (or, alternatively, loaded in parallel from the micro-instruction instruction field 152a) at a time determined by the output of programmable rate clock (i.e, indicating the end of the current state) so as to fetch the micro-instruction corresponding to a next state from WCS 150. As explained previously, a pipeline register (154,158 in FIG. 5, and shown in FIG. 6 as a latched output of RAM 600) is used to hold the "next state" micro-instruction.

Host processor 126 can read and write to WCS 150. When host processor 120 reads from sequencer 140 it may also read a 16-bit status word generated by read status logic block 550. The status word provided by read status logic block 550 includes such information as the current page of WCS (1 or 0) being accessed by the sequencer, various error condition signals (e.g., indicating that the host attempted to write to the same page of WCS 150 as the sequencer 140 was reading from), and parity error related signals.

WCS 150 in the preferred embodiment provides most of the components of sequencer 140. The heart of WCS 150 is a static, very fast random access memory (RAM) array 600 comprising 32,768 words (with each word having a width corresponding to the width of the micro-instruction format). WCS 150 also includes various memory addressing functional blocks, such as a column counter 700 and associated memory chip select logic 800; a row counter 900; an address multiplexer 1000; and parity-related components 1100, 1200, 1300 (the latter parity-related components are for detecting memory read/write errors, as will be explained shortly).

Figure 6A:
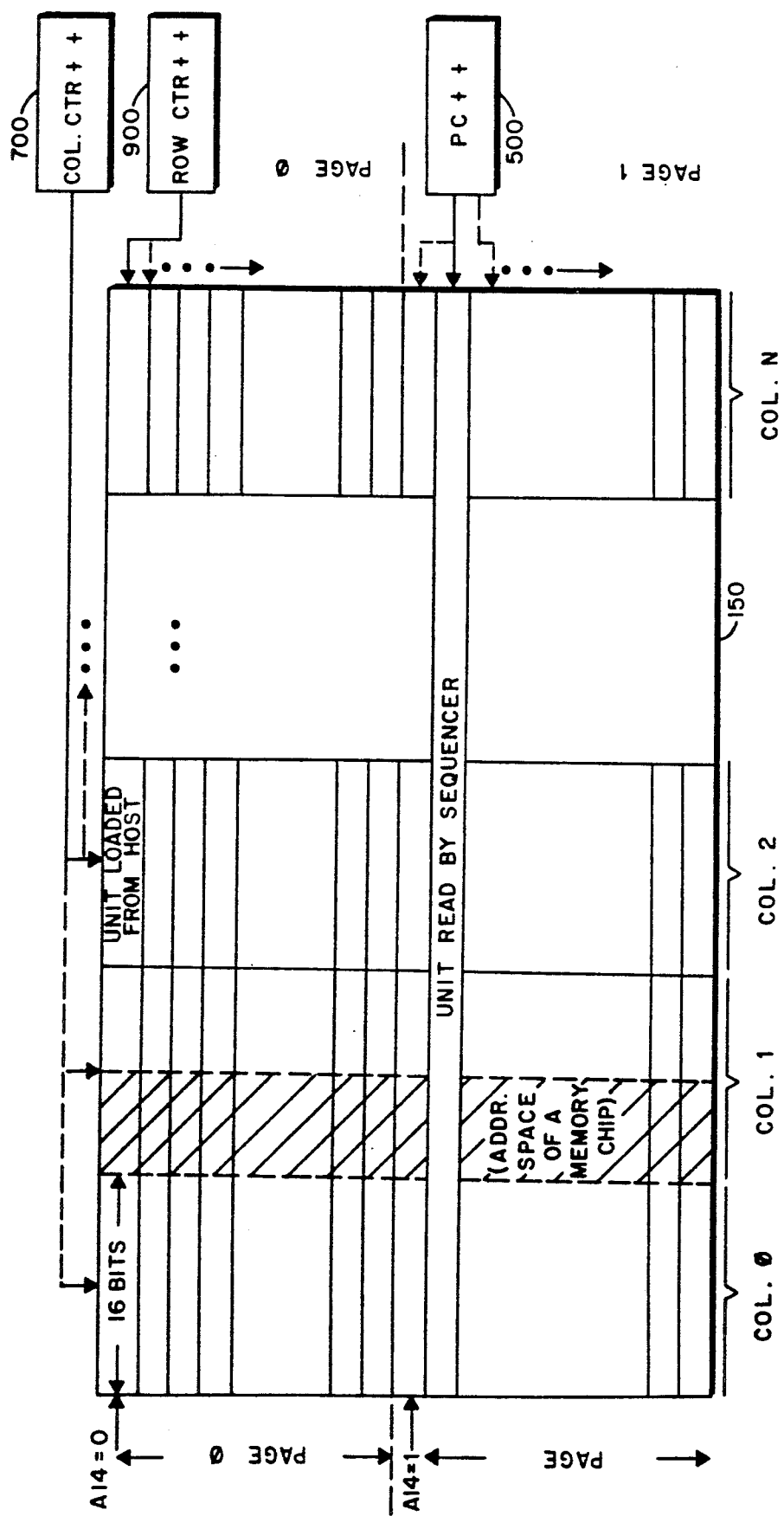
FIG. 6A is a schematic illustration of the memory organization of the writable control store shown in FIG. 5.

RAM 600 in the preferred embodiment comprises an array of 32K×8 bit RAM chips (type M5M5256) configured and organized such that it can be accessed in two different ways depending upon whether the sequencer 140 itself, or the host processor 126, is accessing it (as shown in FIG. 6A). Memory address multiplexer 1000 selects between access of WCS 150 by host processor 126 (via row counter 900 and column counter 700) and access of the WCS by sequencer 140 (via program counter 500).

When the sequencer 140 reads from RAM 600, an entire "row" of RAM 600 (i.e., all of the individual RAM memory chips within the array) is read in parallel as a unit (see FIG. 6A)—with each RAM chip receiving the 15-bit address generated by program counter 500.

Since the host processor QBUS data path is sixteen bits wide, the RAM 600 memory array must be accessed and written to in 16-bit wide portions when it is being loaded by host processor 126. Thus, for purposes of loading, RAM 600 is accessed two 8-bit RAM chips at a time (each "unit" of the memory thus comprises two RAM chips providing a 16-bit wide block)—and host processor 126 thus writes into a sequence of multiple (e.g., N) 16-bit wide "columns" of a row before moving on to the next row. For purposes of writing to RAM 600 from the host processor 126 QBUS, column counter 700 and associated memory chip select logic 800 generates a sequence of control signals /WE, /OE (in this specification, a negative logic signal is indicated by the symbol "/" preceding the signal name) in order to select "columns" of the RAM array—and row counter 900 provides an auto-increment row address count (auto-increment is in response to a "carry out" from column counter 700 in the preferred embodiment) for selection of an ascending address order sequence of rows of RAM 600.

To begin a write to sequencer 140, host processor 126 simply addresses the sequencer and then applies to the bus an appropriate number (e.g., 32K×N) 16-bit words (where N is the width of the sequencer micro-instruction divided by 16) in an appropriate order (as predetermined beforehand by the correspondence between the organization of columns of RAM 600 with the micro-instruction output fields 152—see FIG. 6A). Sequencer 140 automatically writes the transmitted words into RAM 600 (e.g., beginning at the "top" of a page of RAM and proceeding toward the "bottom" of the page) such that a maximum of one page of RAM is filled. Writing to RAM 600 is not truly "continuous" in the sense of being "uninterrupted"—since sequencer 140 if it is running, may from time to time extend a QBUS write cycle for one or more 250 ns sequencer micro-instruction cycle times while the sequencer takes priority to access WCS 150.

Sequencer 140 assumes that host processor 126 will always send down up to one full page of data (if the entire page is not needed, the unused space may be buffered with data that will not, if accidentally executed, cause undesired sequencer output states to occur). The host 126 may send down in excess of one full page of data—but, as will be explained shortly, an error condition will arise if this occurs while the sequencer is running.

It will thus be understood that each of the 32K×B memory chips within the memory chip array comprising RAM 600 in the preferred embodiment stores an 8-bit wide portion of each page 1 micro-instruction and an 8-bit wide portion of each page 0 instruction (the exemplary address pulse of a single preferred embodiment memory chip is shown in phantom in FIG. 6). The point of division between pages in the preferred embodiment is largely arbitrary (two pages of equal size with the MSB of the 15-bit memory address also serving as a Page 0/1 indicator). Page arbitration in the preferred embodiment is a relatively simple arrangement of more or less "trusting" the host processor 126 to never attempt to write into the page currently being read by the sequencer 140 and generating a halt/error condition if such an improper write to an active page is detected.

In a different (not necessarily entirely equivalent) implementation (e.g., wherein the host processor bus cannot be extended asynchronously by the sequencer 140), it might be desirable to organize RAM 600 as two independent memories (one for each page) such that the host processor 126 could write into one of the two pages of memory at the same instant that sequencer 140 reads from the other page of memory. Such an alternate organization would be somewhat more complex than the preferred embodiment RAM organization described above, since it would require independent data busses, buffers and the like for each of the two pages of memory and would also require a tri-state or other multiplexing memory output structure in order to select the output of the active memory. However, such an independent page memory arrangement would allow execution of microcode memory locations at a single clock cycle per state change in one of the two independent page memories while the other page memory is being loaded—and would thus remove the time constraint discussed above with respect to access to the control store by the host processor 126. Even so, if the sequencer 140 were processing micro-instructions at a maximum 250 ns rate, the host processor 126 would eventually fall behind in the loading of memory pages unless there were a significant amount of looping executed within the microcode to extend the execution time of a single memory page. As mentioned above, the preferred embodiment avoids the additional complexity and cost of an independent page memory configuration by taking advantage of the speed differential between the slower QBUS and the relatively fast sequencer cycle time.

As mentioned above, parity-related components 1100-1300 within WCS 150 ensure that no errors occur during reading from and writing to the WCS. Since the micro-instruction output fields directly control RF transmitting, RF receiving and gradient magnet equipment, a read/write error could possibly damage the equipment of the NMR system 100. Accordingly, the preferred embodiment sequencer 140 includes an elaborate parity checking arrangement including a parity RAM 1200 shadowing micro-instruction RAM 600; a parity generator 1300; and a parity checking circuit 1100 (see FIG. 6). When micro-instruction RAM 600 is loaded, parity generating circuit 1300 determines parity information corresponding to each byte of the micro-instruction data being written and stores this parity data into a parity RAM 1300. Parity RAM 1300 may be thought of as an extension of micro-instruction RAM 600, since it is configured as part of the RAM 600 array and is accessed in parallel with the RAM 600, since it is configured as micro-instruction read operations (although it is written to in a slightly different manner during WCS loading, as will now be explained).

During loading of micro-instruction RAM 600, the parity of each byte written into the RAM 600 is calculated. The parity bits corresponding to all of the bytes within a given RAM 600 row (i.e., micro-instruction) are collected together (e.g., in shift registers) by parity generator 1300, which then stores these parity bits together in a corresponding row of parity RAM 1200 as a "parity word" corresponding to the micro-instruction. When the sequencer 140 reads a micro-instruction from RAM 600, it also reads in parallel from parity RAM 1200 to retrieve the "parity word" corresponding to the micro-instruction. The parity of each byte within the micro-instruction is calculated by parity checking block 1100, and the calculated bits are compared with corresponding parity bits within the parity word read from parity RAM 1200. If a parity bit mismatch is detected, the sequencer 140 output states are immediately set to "safe" defaults and the entire sequencer will halt and an interrupt will be sent to the host.

Now that the overall architecture of sequencer 140 has been described, some of the more relevant aspects of the detailed structure and operation of the sequencer will be described in connection with FIGS. 7A-13B. FIGS. 7A-13B are simplified schematic diagrams of the many of the various functional blocks shown in FIG. 6. Not all of the detail of each of the functional blocks is shown in the more detailed schematics, since all such additional detail is not necessary or even helpful to an understanding of the manner in which sequencer WCS 150 is written to and/or read from—and in any event, those skilled in the art will readily be capable of providing whatever additional information is necessary to construct relevant structures and circuit. In addition, not all of the structures and signals shown in FIGS. 7A—13B will be described in this specification, since those skilled in the art will readily understand the function and operation of such structures and signals by mere inspection of the FIGURES in conjunction with the description that is provided.

Figure 7A:
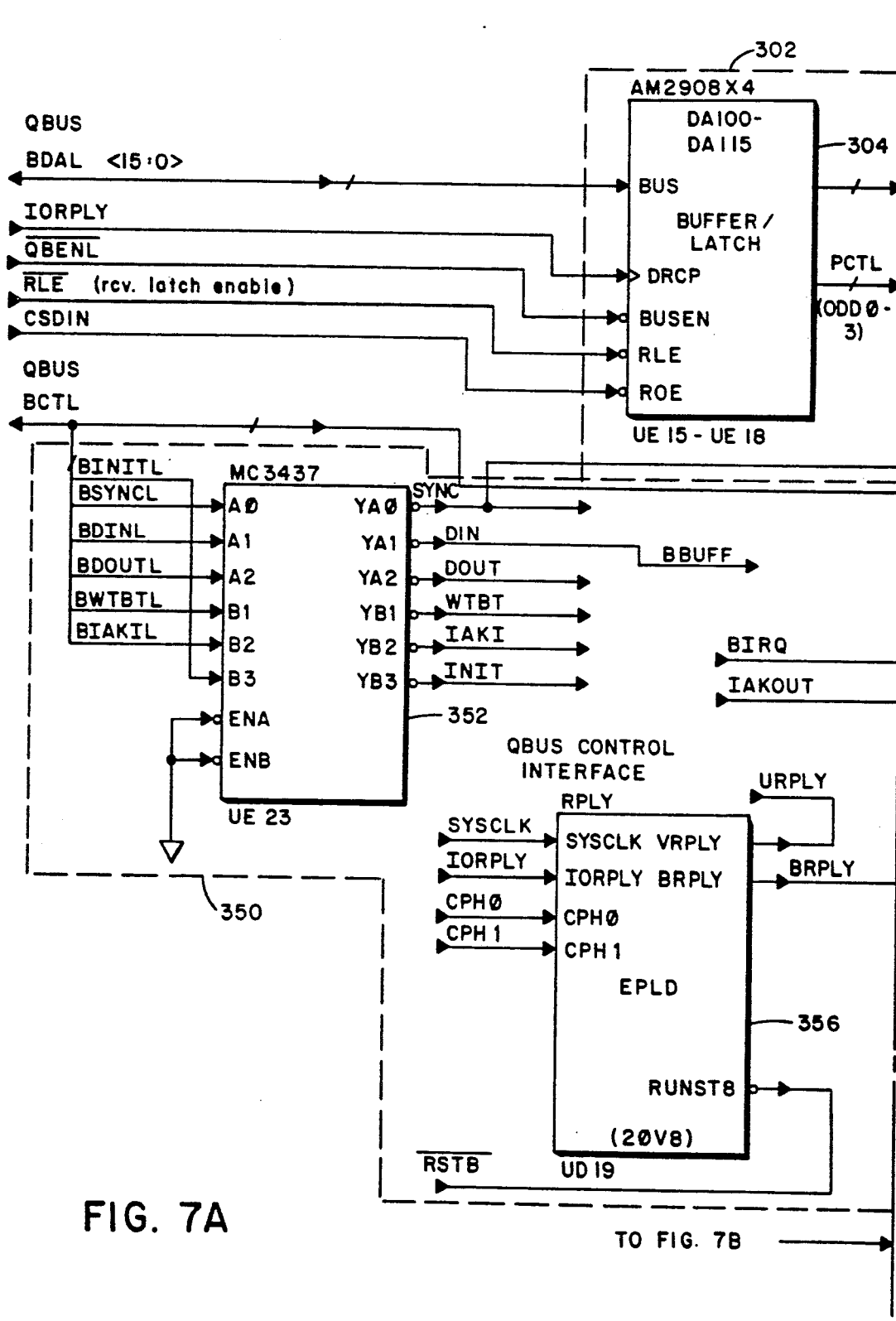
FIGS. 7-13 are more detailed schematic diagrams of the architecture blocks shown in FIG. 6.
Figure 7B:
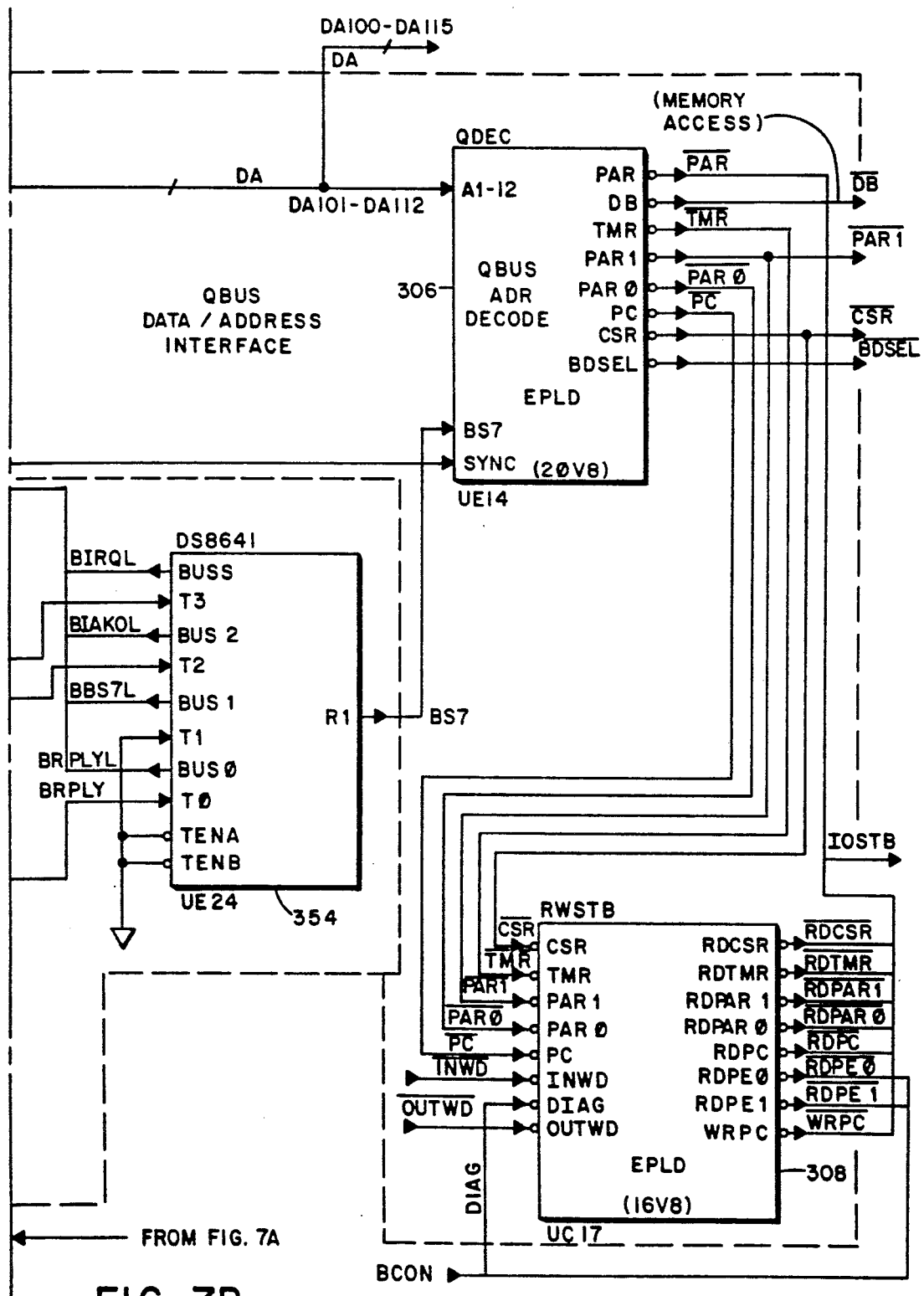

FIGS. 7A—7B are together a detailed schematic diagram of exemplary circuit configurations for QBUS data/address interface block 302 and QBUS control interface block 350 shown in FIG. 6.

The QBUS data/address interface block 302 in the preferred embodiment includes a buffer/latch type bus interface 304, an address decoder ("QDEC") 306, and a read/write control logic block ("RWSTB") 310. In the preferred embodiment, QDEC 306 and RWSTB 310 each comprise custom-programmed electronically programmable logic devices ("ELPDs"). Such devices implement gate arrays and flip-flops so as to provide compact, reliable logic networks (as is well known). Buffer/latch 304 buffers the incoming 16-bit multiplexed address/data path from the host processor 126 QBUS and also calculates parity for the incoming data. The buffered QBUS address signals (or data signals, as the case may be) are applied by bus interface 304 to the internal-to-sequencer multiplexed address/data bus DA and are also applied to the input of address decoder 306 ("QDEC"—UE14). Address decoder 306 decodes addresses appearing on the QBUS in order to determine when the host processor 126 attempts to access sequencer 140, and generates a signal /DB whenever a host-to-memory access is decoded. QDEC 306 also generates various other control signals which are applied to the input of RWSTB 308 so as to generate internal sequencer control signals (carried over the internal control bus BCON).

QBUS control interface block 350 in the preferred embodiment includes a control signal buffer 352, a buffer/driver 354, and a bus reply signal 356. Bus reply signal generator 356 in the preferred embodiment comprises another ELPD ("RPLY"—UD19) that receives clock signals and an internally generated signal "IORPLY" and responsively generates an output signal "BRPLY" for application to the QBUS via driver 354. An inverted version of this signal ("BRPLYL") is treated by host processor 126 as an acknowledgement signal indicating that the current QBUS cycle has completed successfully (and is thus asserted by sequencer 140 when a 16-bit data word applied to the QBUS by the host has been successfully stored in WCS 150.

When a Q22 bus write cycle begins, the bus interface address decoder QDEC 306 detects that the sequencer memory write port is selected, and in response, begins to handle a QBUS bus cycle by asserting /DB (indicating a microcode memory access). The data from the QBUS is latched by bus interface 304 when a signal /BDOUT is asserted by the host processor 126 on the QBUS, causing the buffered signal DOUT (output of buffer 352) to be asserted as an input to SCS 400. This signal helps SCS 400 to generate a further signal called /RLE ("receive latch enable"), which is deasserted so that the data from the QBUS can be latched into the receiver registers of bus interface 304.

Figure 8A:
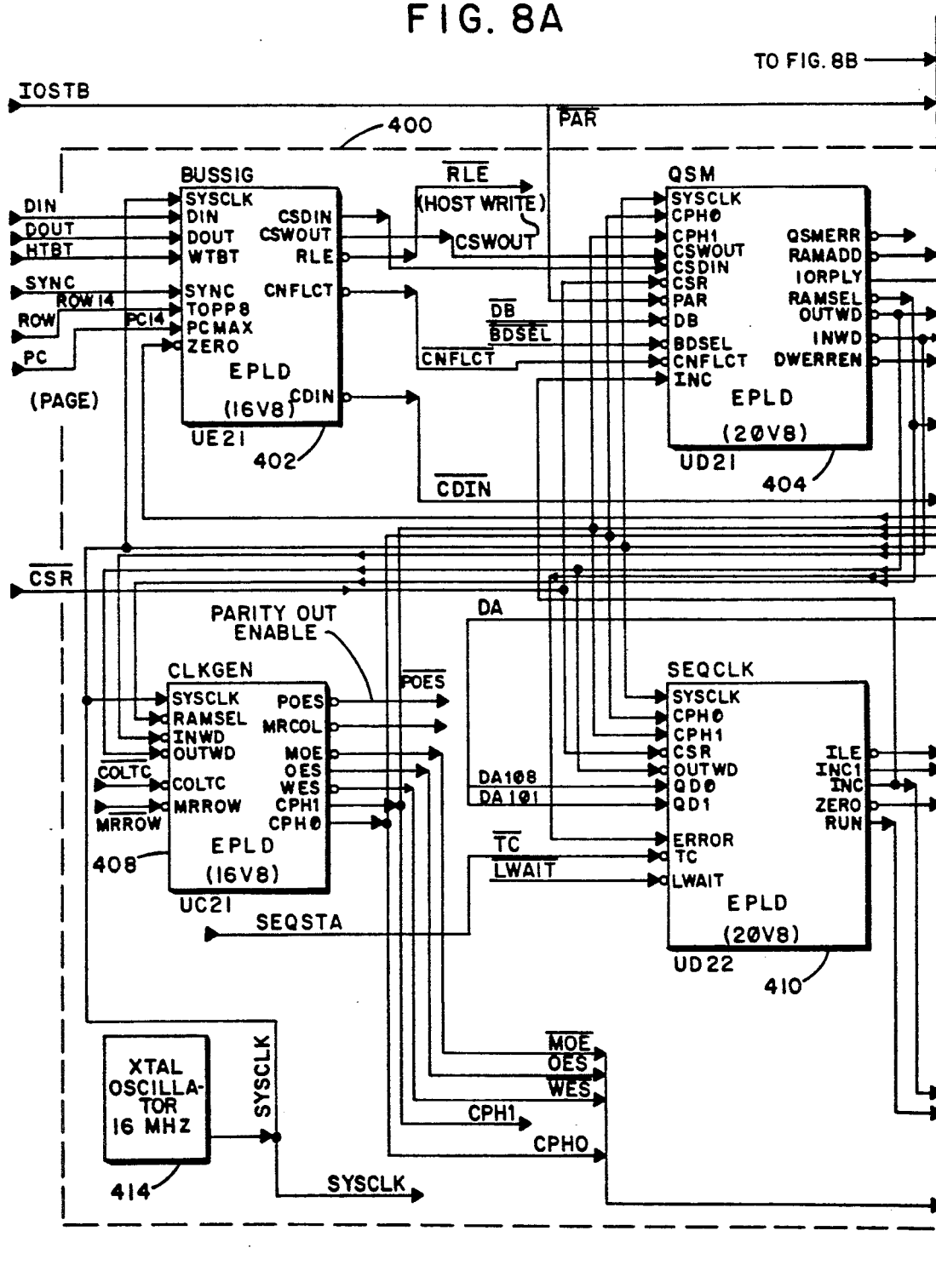
Figure 8B:
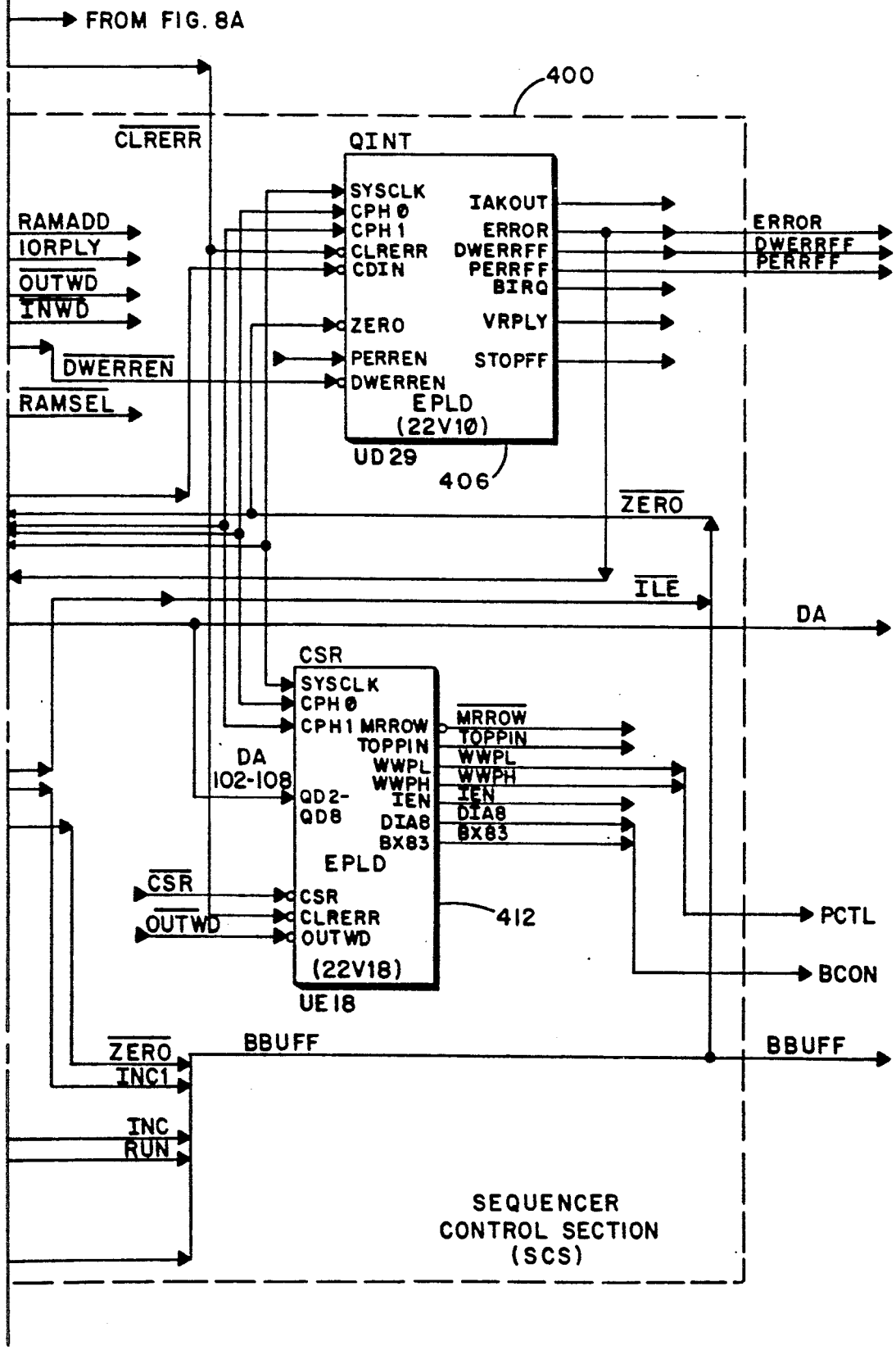

FIGS. 8A–8B together are a detailed schematic diagram of SCS 400 shown in FIG. 6. Just as much as WCS 150 is the "heart" of sequencer 140, SCS 400 is the sequencer's "brain". SCS 400 generates various control signals which synchronize all of the other portions of sequencer 140 with one another.

SCS 400 in the preferred embodiment is based on six ELPDs: BUSSIG ELPD 402, QSM ELPD 404, QINT ELPD 406, CLKGEN ELPD 408, SEQCLK ELPD 410, and CSR ELPD 412. In addition to the ELPDs mentioned above, SCS 400 includes a 16 Mhz crystal oscillator 414 which generates a 250 ns system clock signal for synchronizing the operations of sequencer 140. The output of crystal oscillator 414 is applied to CLKGEN 408, which produces a 4-phase clock signal as follows: CPH1, CPH0:

TABLE I

| Clock Phase | CPH0 | CPH1 |
| --- | --- | --- |
| 0 | 0 | 0 |
| 1 | 1 | 0 |

TABLE I-continued

| Clock Phase | CPH0 | CPH1 |
| --- | --- | --- |
| 2 | 1 | 1 |
| 3 | 0 | 1 |

This type of clock representation is called a "grey code." The period of the SYSCLK clock output signal provided by crystal oscillator 414 is 250 ns —and each of the four clock phases is thus 62.5 ns in duration. Different internal events occur within sequencer 140 on different internal clock phases in order to sequence different internal operations within a single 250 ns micro-instruction cycle time.

BUSSIG 402 provides a further interface between the QBUS signals of host processor 126 and sequencer SCS 400. Briefly, it is the responsibility of BUSSIG 402 to assert the /RLE signal (mentioned previously) that causes buffer/latch bus interface 304 shown in FIG. 7A to latch the QBUS data signal. In addition, BUSSIG 402 asserts a signal called CSWOUT to indicate that a host write cycle has started. This CSWOUT signal (along with the /DB signal provided by QDEC 306 discussed above) causes QSM 404 to initiate and control a properly synchronized write cycle.

In addition to performing the functions discussed above, BUSSIG 402 also receives the most significant bit of program counter 500 and the most significant bit of row counter 900. BUSSIG 402 compares these two bits to determine whether host processor 126 is attempting to load the page of WCS 150 that sequencer 140 is reading out of. If such a page conflict is detected, BUSSIG 402 asserts a signal called /CNFLCT indicating to QSM 404 that an error condition exists.

The following are exemplary Boolean logic expressions corresponding to some of the relevant functions performed by the BUSSIG ELPD 402:

| | |
| --- | --- |
| TOPMAX = | [TOPPG, PCMAX] |
| /CNFLCT = | (PCMAX XNOR TOPPG) & /ZERO |
| | (assert page conflict when running) |
| /RLE = | SYNC % NOT(DOUT) |
| | (receiver latch enable) |
| CSWOUT = | SYNC & DIN |

As mentioned above, QSM 404 is responsible for performing a properly synchronized write cycle from the QBUS. In the preferred embodiment, QSM 404 is a state machine that keeps track of the states of the host processor 126 Q22 bus. QSM 404 receives the CSWOUT signal and the /CNFLCT signal from the BUSSIG 402, and also receives the /DB signal (and various further input signals) as input. QSM 404 generates the IORPLY signal (discussed previously in connection with RPLY 356 shown in FIGS. 7A–7B) that permits the host processor 126 QBUS cycle to finish. QSM 404 also generates, during an appropriate time within a host processor write cycle, an active signal /RAMADD which has the effect of causing WCS 150 to be addressed by row and column (see FIG. 6A) so that it can be written into from the QBUS (this /RAMADD signal is applied to memory address multiplexer block 1000 shown in FIG. 12 so as to select the ROW output of row counter 900 instead of the PC output of the program counter 500, for example). QSM 404 also produces an output signal called /RAMSEL which is applied to CLKGEN 408 as well as to column counter 700.

The following exemplary Boolean logic expressions define the relevant functionality of QSM 404:

| | |
|---|---|
| ram_wr = | NOT (CSDIN) & /CSR & NOT(INC) & /CNFLCT & PAR/ |
| ram_wrerr = | NOT(CSDIN) & /CSR & NOT(INC) & PAR/ & NOT(/CNFLCT) |
| OSM Output State Vectors: | |
| SV = | [/OUTWD, /RAMSEL, /RAMADD, IORPLY] |
| STATE ramoutwd = | [0, 0, 0, 0]; assert outwd, ramsel, ramadd |
| STATE ramout_rply = | [0, 0, 0, 1]; hold outwd, ramsel, ramadd; brply on |
| STATE rply_on = | [1, 1, 1, 1]; normal bus reply state |
| OSM State Transition Expressions: | |
| STATE ramoutwd | |
| (phase = = ph2) | ramoutwd |
| (phase = = ph3) | ramout_rply |

During a valid data buffer write (no page conflict detected), the following state transitions are exhibited by QSM 404 (with DWERREN inactive):

| | |
|---|---|
| (a) ramoutwd | (clk phase 1) |
| (b) ramoutwd | (clk phase 2) |
| (c) rply_on | (clk phase 3) |
| (d) idle | (clk phase 0) |

During a conflict condition (/CNFLCT asserted), the following state transitions are asserted by QSM 404:

| | | |
|---|---|---|
| (a) errset | (DWERREN inactive) | (clk phase 1) |
| (b) errset | (DWERREN active) | (clk phase 2, 3) |
| (c) err_rply | (DWERREN active) | (clk phase 3) |
| (d) rply_on | | (following clk phase) |

As will be noted from the expressions above, if BUSSIG 402 indicates a page conflict by generating the signal/CNFLCT, QSM 404 sets an internal error flip flop and generates error signal /DWERREN. It also generates the IORPLY signal (to permit the QBUS cycle to complete). However, QSM 404 does not generate the /RAMSEL nor the /RAMADD signals under these conditions—thus preventing the host from loading any data into WCS 150. Note that as soon as CSWOUT is asserted during a memory write to the currently running page, BUSSIG 402 detects the error condition and FSCS 400 controls sequencer 140 accordingly.

QINT 406 in the preferred embodiment implements a QBUS interrupt state machine. Briefly, this ELPD 406 produces various signals (e.g., IAKOUT, BIRQ, and BRPLY) which permit sequencer 140 to interrupt host processor 126 via the QBUS. For example, QINT 406 generates interrupts to inform host processor 126 that an error condition exists (e.g., to permit the host processor to read the sequencer 140 status via read status block 550) and also generates an interrupt upon execution of a normal stop micro-instruction.

The output signals ERROR and DWERRFF generated by QINT 406 indicate various sequencer error status conditions in accordance with the following exemplary Boolean logic expressions in the preferred embodiment:

| | |
|---|---|
| DWERRFF = | { (/CLRERR & DWERRFF) OR (/CLRERR & (NOT(clk. ph. 1) & NOT(/DWERREN) & /ZERO) } |
| | (The above implements the data buffer write error flip flop.) |
| ERROR = | (DWERREN OR PERREN) |
| | (error status) |

The ELPD CLKGEN 408 is responsible for generating the four-phase clock in the preferred embodiment, and also generates control signals /POES, /MOE, OES, and /WES which control access to particular subdivisions of RAMs 600, 1200. The /POES signal is asserted at the same time as /WES and OES during clock phase three within a host memory write to enable the outputs of shift registers 1302, 1304, 1306 within parity generator 1300 shown in FIG. 11. Such shift registers 1302-1306 store the (odd or even) parity of bytes of each 16-bit word written into each column of microcode memory 600. Since the microcode 600 is large and the accuracy of the state outputs is essential to ensure correct system operation, the parity of the memory columns is computed and stored when the memory is written using the parity generated by bus interface 304 shown in FIG. 7A/7B. This parity is stored as one bit for each eight bits of data in separate parity RAM 1200 (as already explained). When microcode RAM 600 is written, the parity of each byte is inputted to shift registers 1302, 1304, 1306. When the last column of microcode RAM 600 in each row is written, the parity information is written into the parity RAM 1200 in parallel.

The signal/WES produced by CLKGEN 408 indicates that the sequencer 140 is about to end a write cycle. Signal /MOE provided by CLKGEN 408 effectively disables the output of microcode RAM 600 during a memory write, while signal OES (along with WES) is used by memory chip select block 800 to select particular columns and specific chips within the array of memory chips that makes up microcode RAM 600 in the preferred embodiment.

The following are exemplary Boolean logic expressions controlling the preferred embodiment ELPD CLKGEN 408 shown in FIGS. 8A/8B:

| CLKGEN | |
|---|---|
| CPH = | [cph1, cph0] |
| PH0 = | [0, 0] |
| PH1 = | [0, 1] |
| PH2 = | [1, 1] |
| PH3 = | [1, 0] |
| CPH = | (CPH = = PH0) & PH1 OR (CPH = = PH1) & PH2 OR (CPH = = PH2) & PH3 OR (CPH = = PH3) & PH0 |
| NOT(/WES) = | (CPH = = PH2) & NOT(/RAMSEL) & NOT(/OUTWD) & /INWD |
| OES = | NOT(/WES) OR {(CPH = = PH3) & NOT(/RAMSEL) & NOT(/INWD) & /OUTWD} |
| /MOE = | NOT(/RAMSEL) & NOT(/OUTWD) |
| NOT(/MRCOL) = | NOT(/MRROW) OR NOT (/COLTC) (master reset for RAM COL. ADR) |
| NOT(/POES) = | NOT(/WES) |

The ELPD SEQCLK 410 shown in FIGS. 8A/8B is responsible for making a decision (in response to the output of the programmable rate clock 160) when the current state is to be terminated and the next state transition initiated. ELPD SEQCLK 410 thus effectively determines when sequencer 140 needs to take priority over and access WCS 150. The signal INC produced by SEQCLK 410 is asserted when a state transition is to occur. This INC signal effects incrementing (or parallel loading) of program counter 500. The signal INC starts in clock phase one in the preferred embodiment (during clock phase zero sequencer 140 decides whether it needs to perform a state transition during the current instruction cycle). The INC signal is applied to an input to QSM 404—and thus (as shown above in the Boolean equations relating to this QSM ELPD) has the effect of postponing a host memory write for one microcode instruction cycle whenever it is asserted.

Figure 9A:
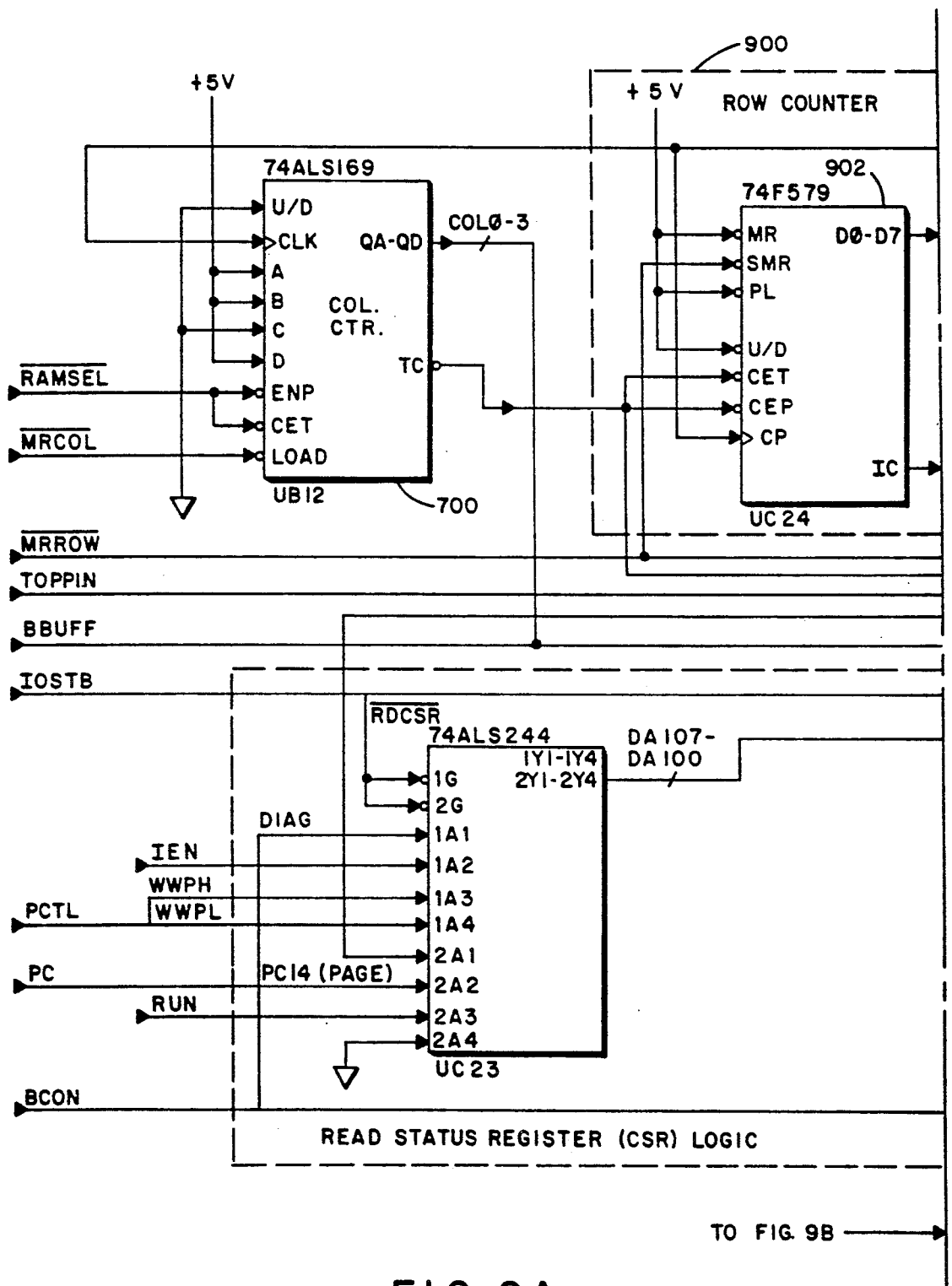
Figure 9B:
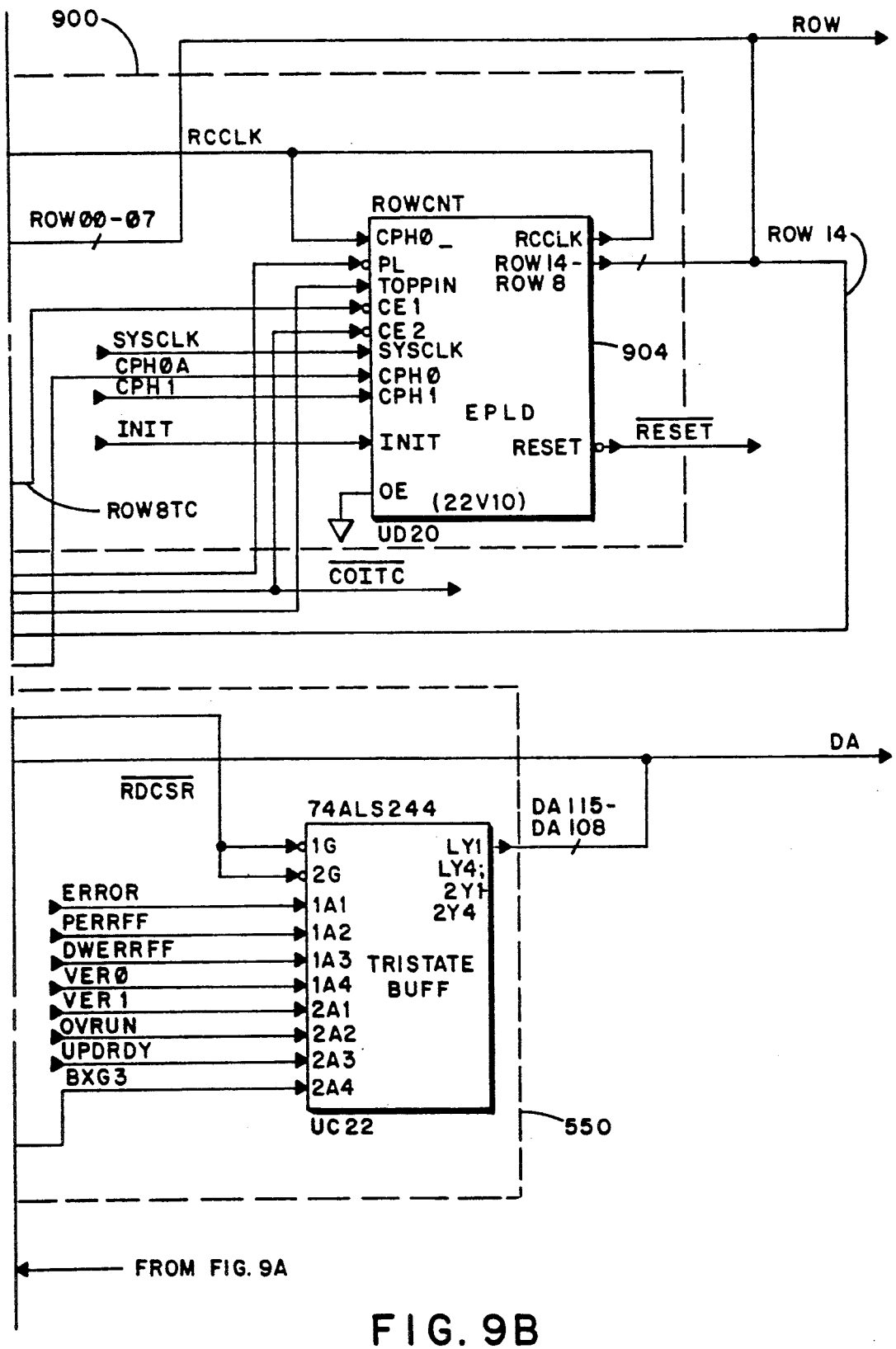
Figure 10:
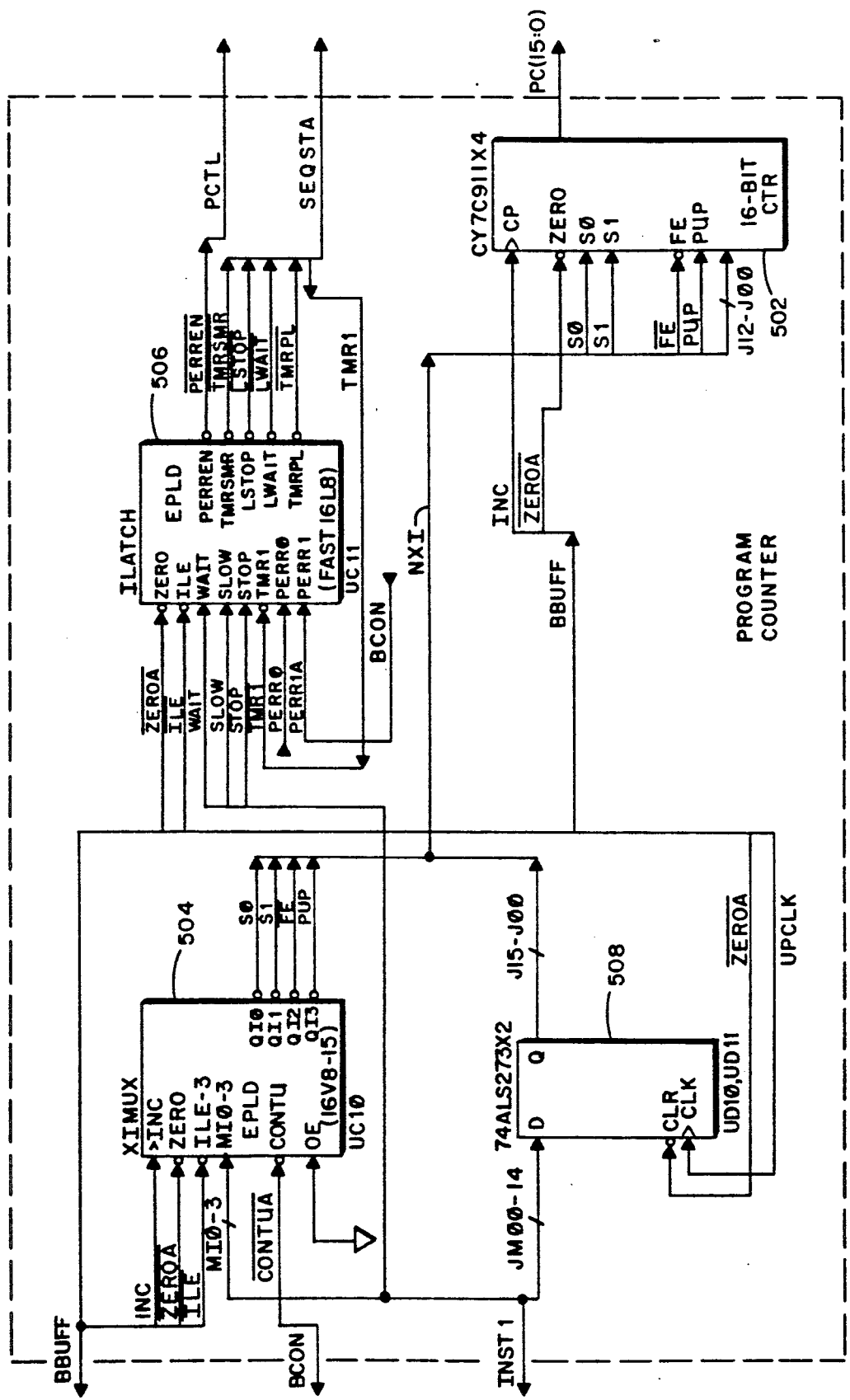

Column counter 700, row counter 900 and read status logic block 550 are shown in FIGS. 9A-9B. Column counter 700 comprises an up counter in the preferred embodiment, and is used to produce column select signals COL for selection of individual memory chips via memory chip select block 800 shown in FIG. 11. The carry output of column counter 700 is applied to an input of 15-bit row counter 900 (which in the preferred embodiment includes two discrete but interconnected counters 902, 904) so as to cause the row counter to increment automatically whenever all of the columns of microcode RAM 600 within the last row have been addressed by column counter 700 (see FIG. 6A). The output of row counter 900 is applied as one input to the multiplexer 1000 shown in FIG. 12. The other multiplexer 1000 input is obtained from the output from program counter 500 shown in more detail in FIG. 10.

The host selects the page of WCS 150 to be written/read by writing two bits into CSR 412 in FIG. 8B. Input DA102 (going to an input QD2 of the CSR 412) is used to reset the row and column counters to zero in a page selected by DA103 (which goes to the QD3 input of CSR 412). If QD2 is asserted, then /MRROW is set low in clock phase 3 and held until the end of clock phase 1, after which it goes high. If QD3 is low at the same time that QD2 is written low, then the output TOPPIN is deasserted and held low. If QD3 is high at the same time that QD2 is written low, then the output TOPPIN is asserted and held high. The ROWCNT ELPD 904 in FIG. 9B uses the /MRROW input at /PL and also receives the TOPPIN input. If TOPPIN is deasserted when /PL is asserted low, then ROW14 (the page select) is set to 0 for page 0 when ROW8-13 bits are set to zero by /PL. If TOPPIN is asserted when /PL is asserted, then ROW14 is set to 1 to select page 1. /MRROW also causes row counter 902 to set bits ROW0-7 to zero. /MRROW is used by CLKGEN 408 in FIG. 8A to geenerate /MRCOL, which resets the column counter 700 in FIG. 9A to zero at the same time the row counter is reset to the beginning of a page.

The following are exemplary Boolean logic expressions controlling the preferred embodiment ELPD CSR 412 shown in FIG. 8B:

| | |
|---|---|
| WRTOP = | (TOPPIN & NOT(QD2)) OR (QD3 & QD2) (latch toppin unless QD2 is active) |
| NOT (/MRROW) = | ((QD2 & NOT(/CSR) & NOT(/OUTWD) OR NOT(/CLRERR)) & (clock phase 2)) OR ((clock phase 3 OR clock phase 0) & NOT(/MRROW)) (CSR WRITE; hold until clock phase 1) |

The following is the exemplary Boolean logic expression controlling the preferred embodiment EPLD ROWCNT 904 shown in FIG. 9B to generate the signal controlling page select:

ROW14=TOPPIN & NOT(/PL)

In the preferred embodiment, program counter 500 is built around a 16-bit counter 502, but also includes additional ELPD logic 504, 506 and a latch 508. (This latch accepts branch addresses from the microinstruction instruction field.) Program counter 500 automatically increments (or alternatively, parallel loads) to provide a new address for microcode RAM 600 in response to the INC and other signals generated by CSC 400. ELPD 506 shown in FIG. 10 relates to parity control and also to control of programmable rate timer 160 (not shown).

Figure 11:
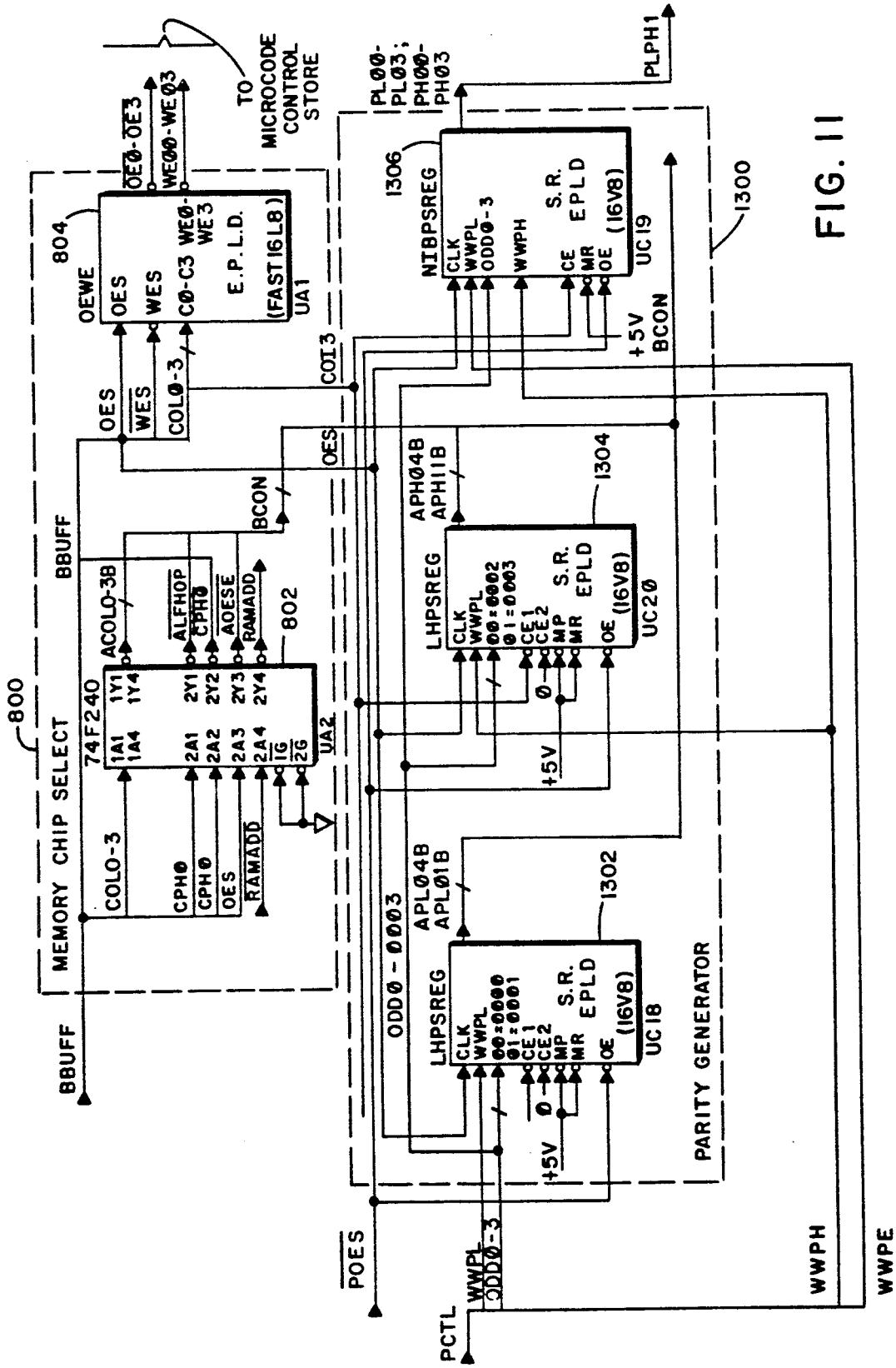

The structure and operation of parity generator 1300 shown in FIG. 11 has already been discussed. The chip select block 800 also shown in FIG. 11 produces several individual output signals /OE and /WE (e.g., /WE0, /WE1, etc.) to select and write enable (respectively) the outputs of individual memory chips within microcode RAM 600. Memory chip select block 800 in the preferred embodiment includes a buffer 802 for buffering control signals (such as the clock signals and the column signals produced by SCS 400) and also includes an ELPD 804 generating individual memory select and enable signals in response to the column signals COL, the OES signal and the /WES signal discussed previously.

Figure 12:
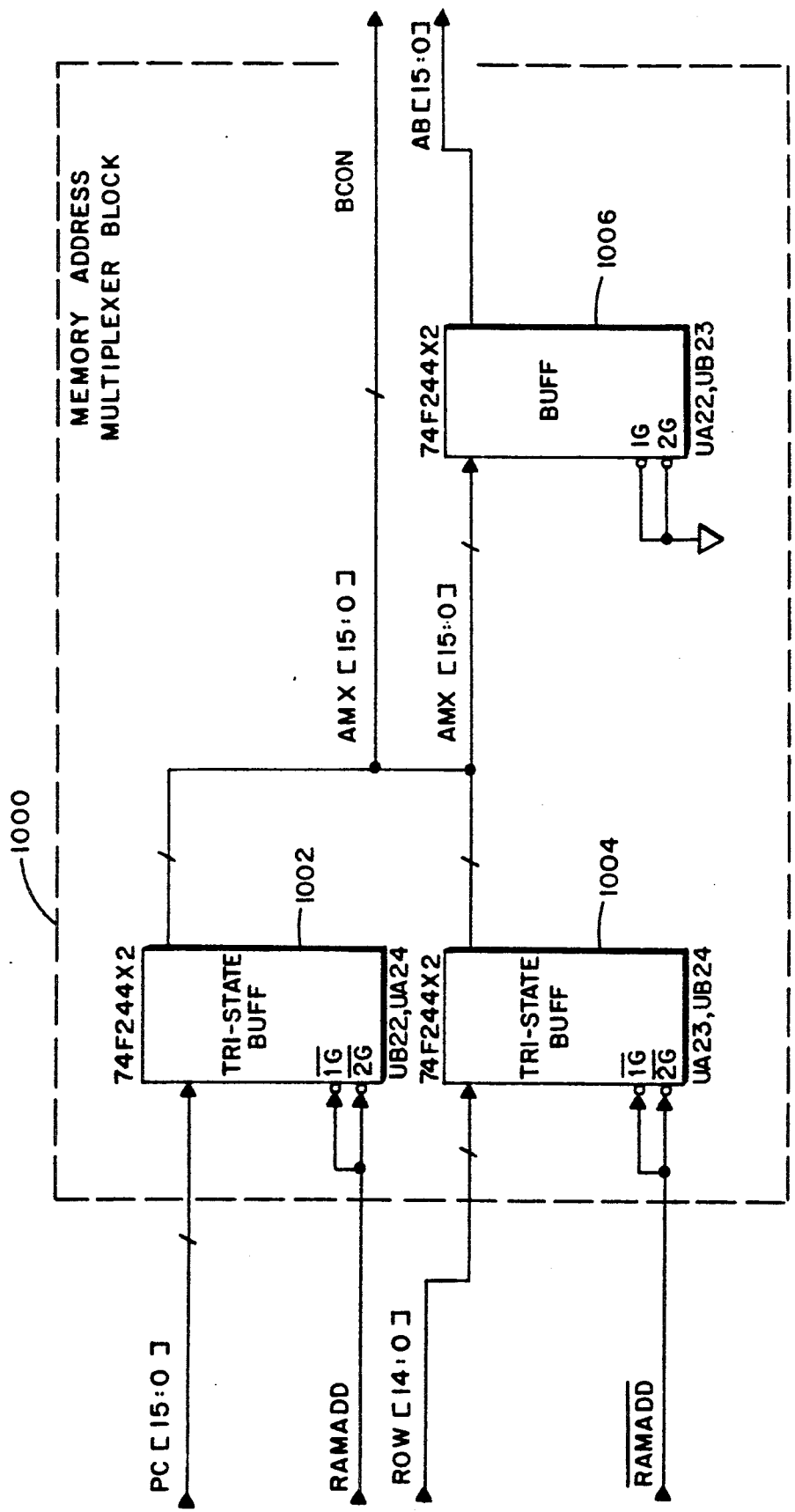

Referring now to FIG. 12, memory address multiplexer 1000 includes first tri-state buffer 1002 accepting the address output PC of program counter 500, and a further tri-state buffer 1004 which accepts the address output ROW of row counter 900. Multiplexer 1000 selects one or the other of these two addresses in response to the state of the /RAMADD signal produced by QSM 404 shown in FIG. 8A/8B. The selected signal is buffered by an address buffer 1006 and is applied via address bus AB to the memory chip address inputs shown in FIGS. 13A/13B.

Figure 13A:
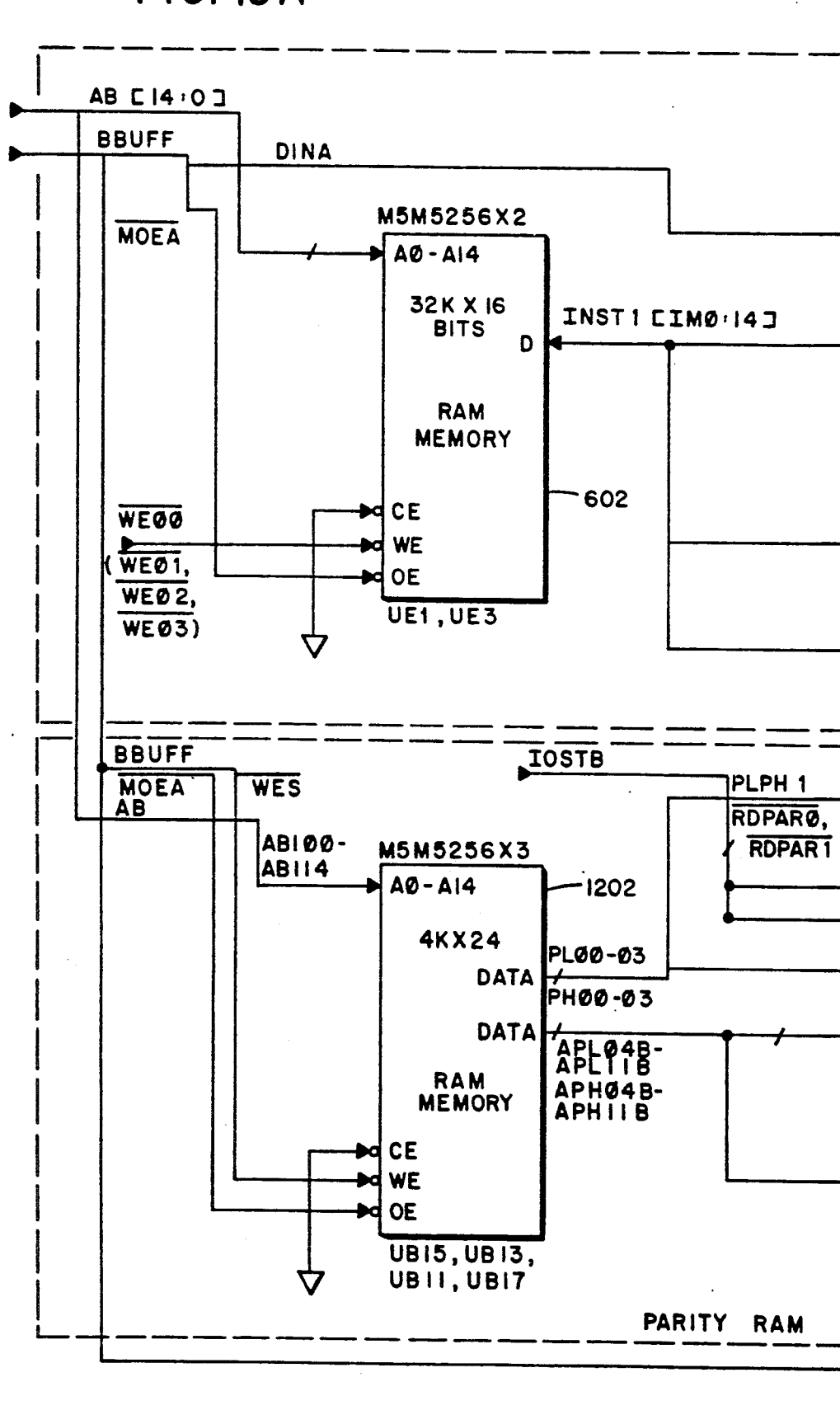
Figure 13B:
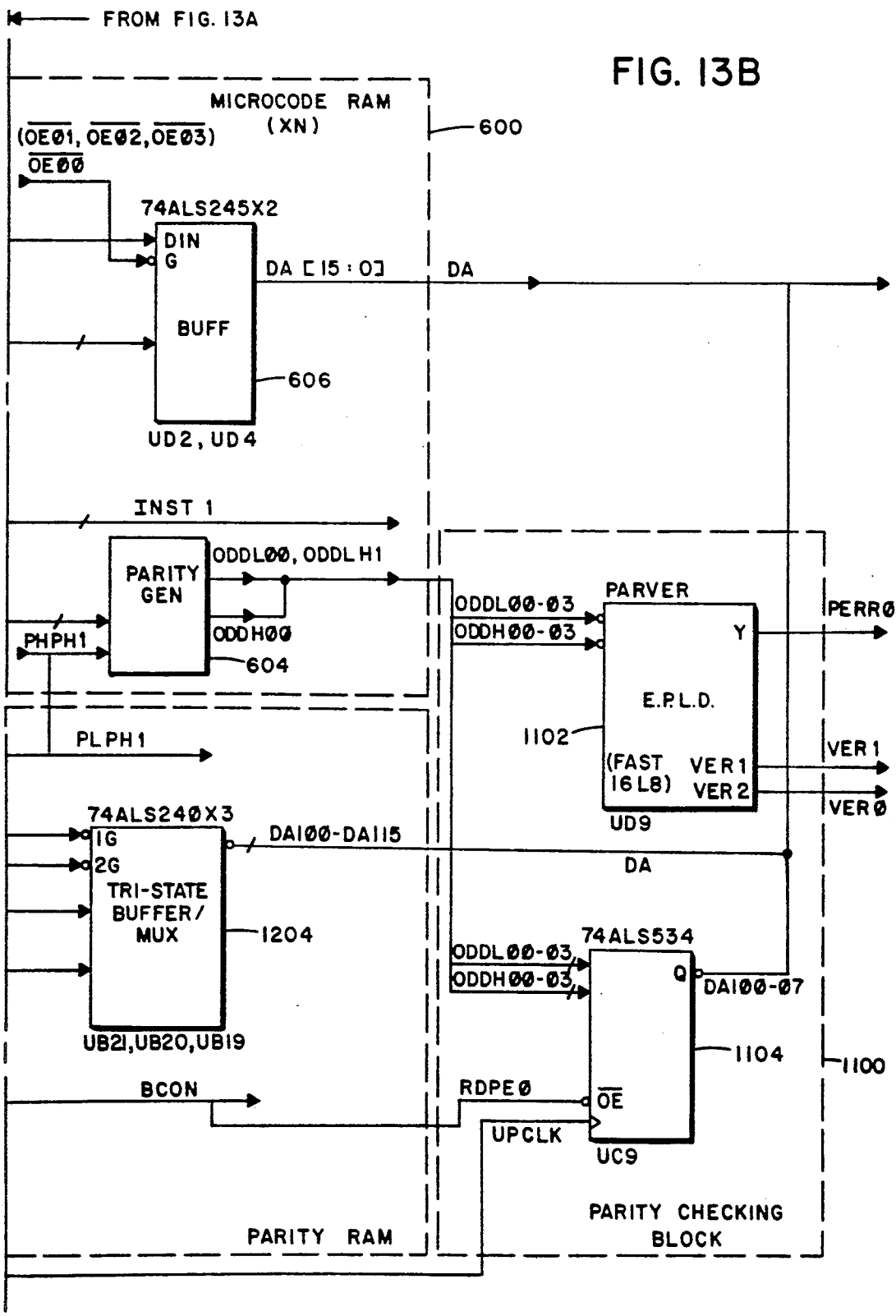

As can be seen from FIGS. 13A/13B, microcode RAM 600 in the preferred embodiment includes plurality (N) of individual, substantial identical building blocks each including a 32K by 16-bit RAM 602, a latch 154, and a parity generator 604. In the preferred embodiment, each 32K by 16-bit RAM 602 actually comprises two individual memory chips operated in parallel—with the output enable inputs of the RAM chips being connected in common to the buffer /MOE signal described above, and the write enable inputs of the RAM chips being connected in common to /WE signals produced by memory chip select block 800 shown in FIG. 11.

The address input of RAM 602 is received from address multiplexer 1000 as already described, and the data input/output of the RAM is coupled to output buffer 606 (which is enabled/disabledin response to the OE signals provided by SCS 400 via memory select logic 800). Buffer 606 is bidirectional—and in the preferred embodiment it also serves to apply the QBUS data signals (which are provided on sequencer internal data/address bus DA) to the data input of RAM 602 during host memory writes in response to the signals DINA generated by QBUS buffer/transceiver 352 of QBUS control interface 350. Parity generator 604 calculates the parity for the 8-bit bytes read from RAM 602 each time the RAM is read.

A parity RAM 1200 building block is also shown in FIGS. 13A/13B. As will be seen, the parity RAM building block 1200 is similar in structure to the microcode RAM building block 600, and includes the parity RAM 1202 (addressed by the same output of address multiplexer 1100 used to address microcode RAM 600) and column and memory write signals of the same nature as those used to address the microcode RAM. The parity RAM 1202 is never written to directly by host-processor 126—and therefore, the output tri-state/-buffer multiplexer 1204 used in the preferred embodiment at the output of parity RAM 1202 serves to multiplex the output of the parity RAM onto the internal data bus DA. Parity is written to the parity RAM 1202 via an internal bus PLPH1—which couples the parity RAM 1200 to the input of parity shift register 1306 shown in FIG. 11. In addition, parity data applied to the internal bus BCON by parity generator shift registers 1302,1304 is applied to another data input of the relatively-wide parity RAM 1202. As with microcode RAM 602, parity RAM 1202 actually comprises an array of individual RAM memory chips connected together appropriately to provide desired parity width.

A parity error checking block 1100 also shown in FIGS. 13A/13B include a parity checking ELPD 1102 which applies a parity error signal PERRO to ILATCH 506 which generates PERREN for application to SCS 400 if microcode RAM parity generators 604 detect parity errors. In addition, the parity data provided by parity generator 604 is applied to the multiplexed data/address bus DA by a buffer 1104 under control of QBUS data/address interface 302. This allows the host to read the parity comparison bits to determine which memory chip failed.

Figure 14:
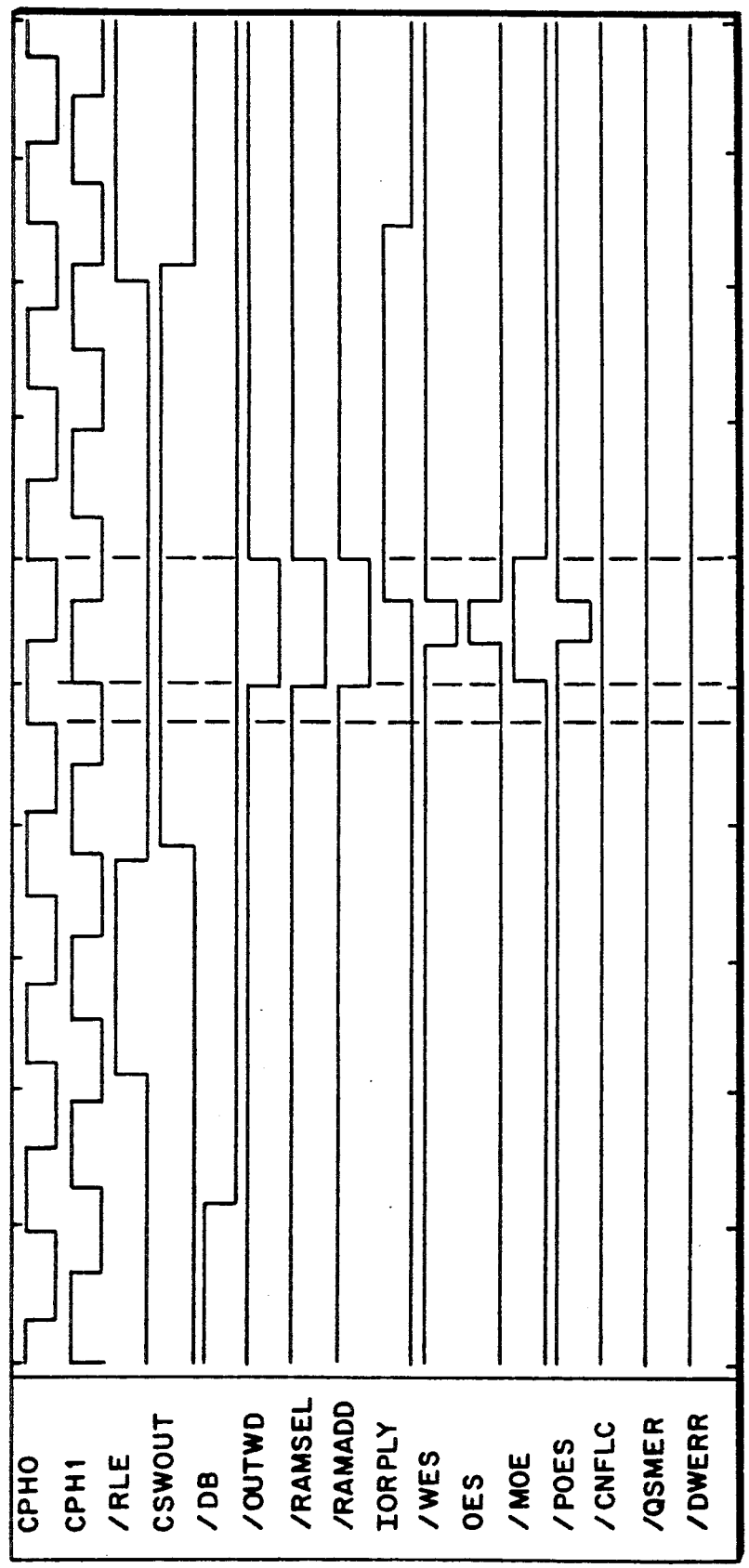
FIGS. 14-16 are timing diagrams of exemplary signals produced by the sequencer shown in FIGS. 6-13.
Figure 15:
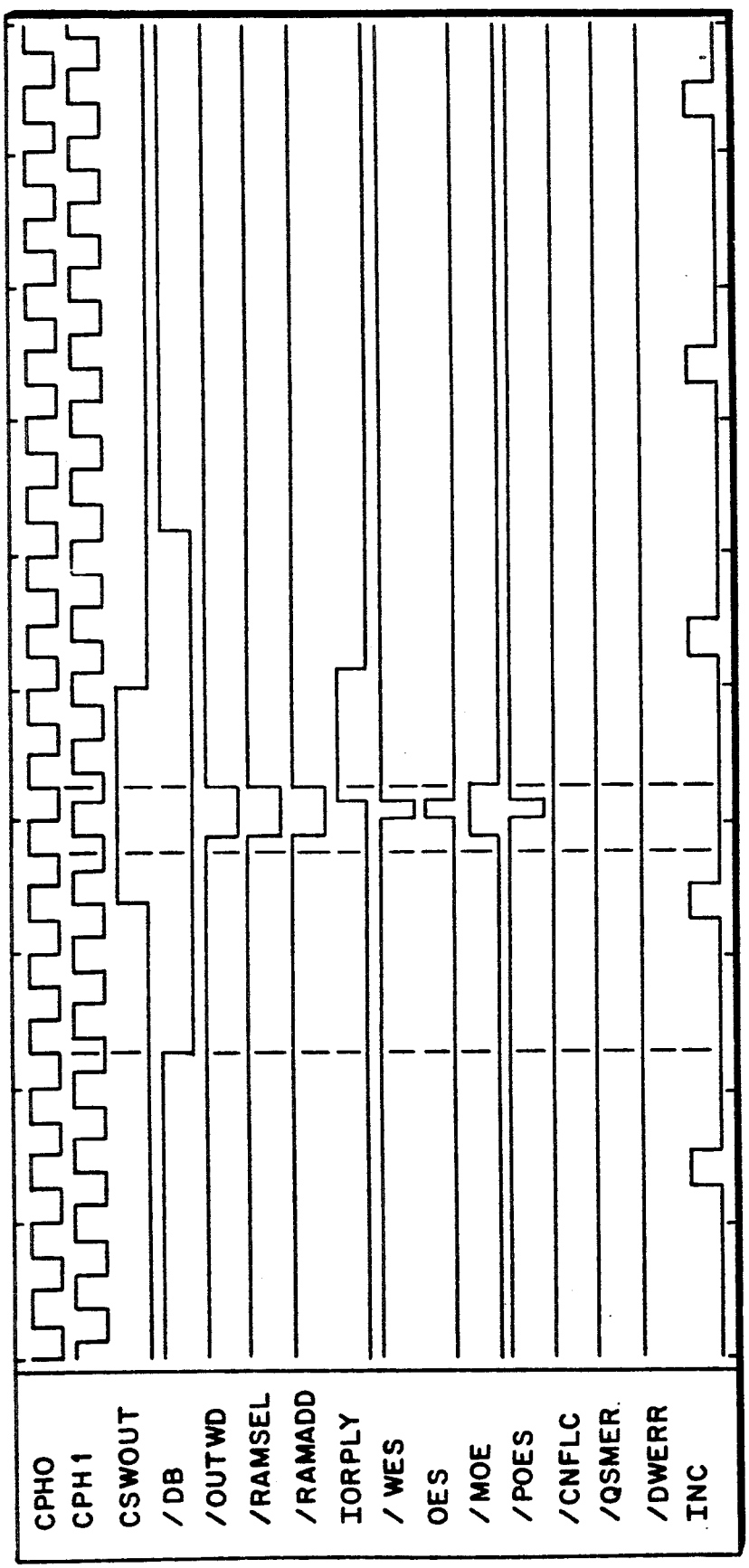
Figure 16:
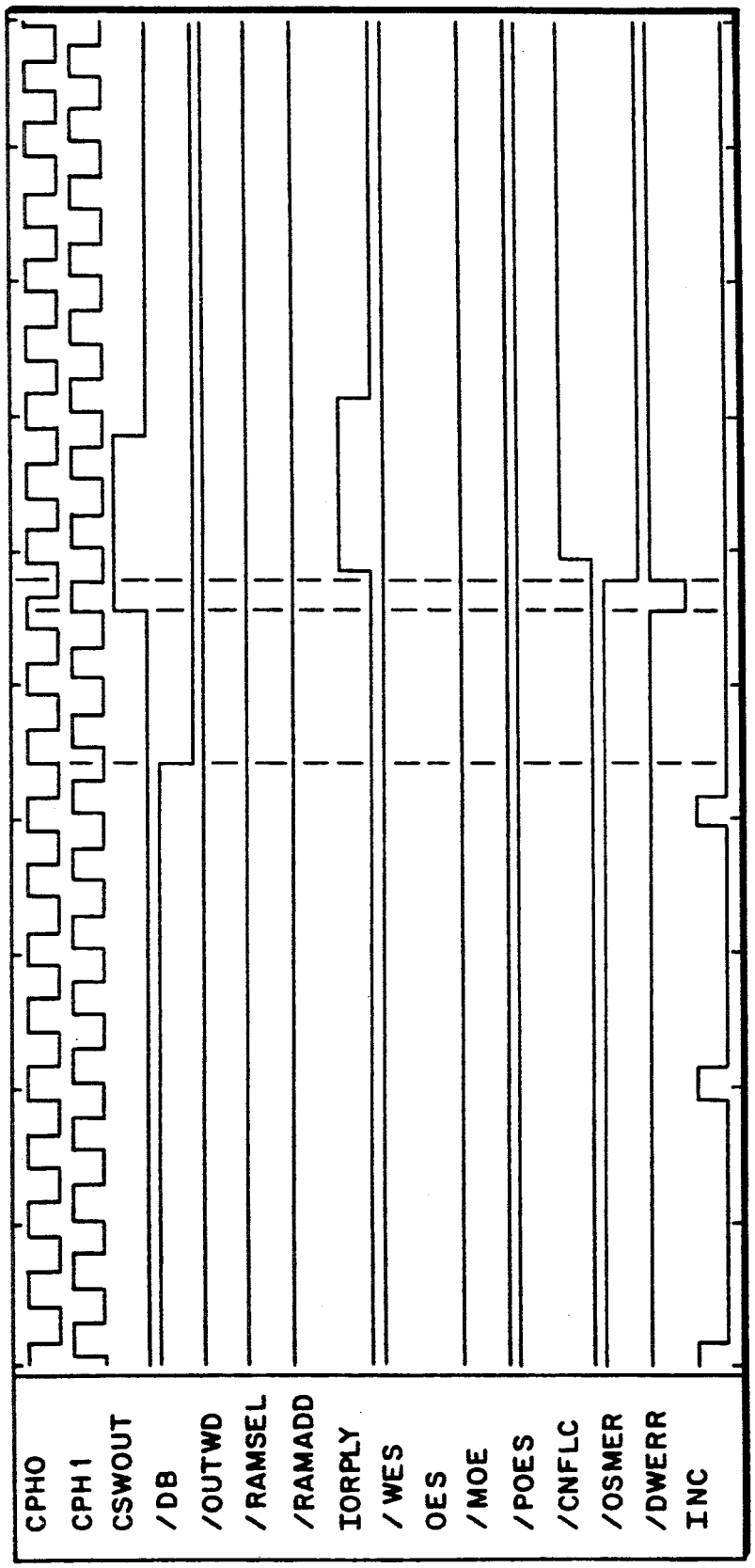

FIGS. 14–17 are exemplary timing diagrams showing some of the signals discussed above during different operations of sequencer 140. FIG. 14 represents a timing diagram for exemplary sequencer 140 operation when host processor 126 writes to the sequencer before the sequencer is running (e.g., during writing of the initial page of WCS 150). FIG. 15 is a timing diagram of exemplary signals existing within sequencer 140 during a host-to-sequencer write at a time when the sequencer is performing state transitions. FIG. 16 is a timing diagram of signals existing within sequencer 140 when a page conflict is detected.

Referring to FIG. 14, signal /DB is asserted by QBUS data/address interface 302 in response to receipt and decoding of an address from the Q22 bus indicating a host write to the sequencer. This signal /DB indicates a microcode access. The host processor 126 soon thereafter asserts data which is QBUS data/address interface 302 in response to the QRLE signal provided by SCS 400. After the data is latched from the Q22 bus, the signal CSWOUT is asserted by SCS 400 to indicate that a host write cycle has begun. On the following clock phase z, the signals /OUTWD, /RAMSEL and /RAMADD are asserted by SCS 400, and the signal /MOE is deasserted by the SCS. As described above, the signal /RAMSEL enables the output of the column address for the microcode memory to provide memory column selection signals along with memory write enable signals. Signals OES and /WES asserted by SCS 400 in clock phase 3 are used to actually strobe the microcode RAM 600. The /MOE signal is deasserted to remove the output enable from microcode RAM 600 during a write.

Meanwhile, the signal /RAMADD is asserted to control memory address multiplexer 1100 to select a ROW address provided by row counter 900 instead of the PC output of program counter 500. When the signal /RAMADD is asserted by SCS 400, the row address from the row counter is enabled onto the BCON internal bus as signals AMX00–104. These signals are provided via multiplexer 1000 to address bus AB so as to perform the memory row addressing function for microcode RAM 600. As described above, when the /RAMADD signal is asserted, microcode RAM 600 is effectively reorganized in row and column units as shown in FIG. 6A.

The /POES signal also shown in FIG. 14 is asserted at the same time as /WES and /OES during clock phase 3. /POES enables the outputs of the parity shift registers within parity generator 1300 as discussed above so as to eventually result in storing of parity information into parity RAM 1200.

The Q22 bus cycle completion begins when the IORPLY signal is asserted in clock phase zero after /WES is deasserted. IORPLY causes Q22 bus reply /BRPLY to be asserted by QBUS control interface 350 so as to signal the end of the write cycle to the host processor 126. The duration of the IORPLY is independent of future state changes of sequencer 140. CSWOUT is deasserted when the Q22 bus cycle completes, and one clock phase later, the IORPLY signal is deasserted as a result. This completes the write to WCS 150 when sequencer 140 is not running.

FIG. 15 is a timing diagram of a write by host processor 126 to sequencer 140 when the sequencer is running. Continual loading of sequencer WCS 150 occurs in such a way that the outputs of the sequencer 140 are not interrupted (even though the size of the memory is not large enough for all of the microcode needed to execute an NMR pulse sequence). /DB is asserted asynchronously between two sequencer state changes in the example shown (the sequencer changes state each time the INC signal is asserted in clock phase one). In clock phase two (while INC is still asserted), the signal CSWOUT is asserted to prepare for a write to WCS 150 during the next available micro-instruction cycle when a sequencer state change is not occurring. QSM ELPD 404 within SCS 400 determines when INC is asserted, and delays the assertion of /RAMSEL and /RAMADD until INC is not asserted (thus delaying, one micro-instruction cycle at a time, the write operation). Note that (as shown in FIG. 14) the host-to-sequencer write operation is performed within a single 250 ns micro-instruction time, so that only one "free" micro-instruction cycle needs to occur between successive 250 ns short micro-instruction cycle times in order to "let the host in" and write to WCS 150.

After INC is deasserted (and since another state change will not occur immediately as the result of a minimum 250 ns state duration), the test for another INC performed by QSM 404 is false in the example shown. As a result, the /OUTWD and other control signals are asserted by SCS 400 to start the write to microcode RAM 600 in clock phase two, and the microcode RAM is written in the same way as when the sequencer 140 is not running. During the following clock phase zero (while these signals are still asserted), QSM 404 again tests the state of the INC signal so that it could be asserted in clock phase one. SCS 400 thus test during clock phase one whether the INC signal is asserted—and if it is asserted, suppresses the row and column address signals and other associated signals used to effect a write to WCS 150. If, on the other hand, INC is not asserted during clock phase one and a host write request is pending, SCS 400 generates the /RAMADD, /POES, /MOE and other associated signals in clock phases two and three to effect the microcode write.

FIG. 16 is a timing diagram of exemplary signals existing within sequencer 140 when a page conflict occurs. As before, the /DB signal is asserted in response to a host write request, the Q22 bus data signals are latched, etc. However, as soon as the CSWOUT signal is asserted, SCS 400 detects a page conflict error condition via the ELPDs BUSSIG 402 and QSM 404 (shown in FIGS. 8A/8B)—causing an error interrupt to be issued (via ELPD QINT 406) and sequencer 140 to halt. The IORPLY signal is still asserted (see FIG. 16) so that the Q22 bus cycle is completed to prevent a bus timeout.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A microcoded NMR pulse sequencer for providing real time NMR system control signals, said sequencer including:
   a writable microcode control store adapted to store micro-instructions;
   a readout circuit operatively coupled to read a sequence of micro-instructions from said microcode control store;
   an output circuit coupled to receive said micro-instructions read by said readout circuit, said output circuit generating output signals for controlling real time generation of a sequence of NMR pulse stimulations; and
   a loading circuit operatively coupled to said control store, said loading circuit effecting loading of micro-instructions into said control store without interrupting said real time generation of said sequence of NMR pulse stimulations.

2. A magnetic resonance imaging (MRI) system for imaging a body containing NMR sensitive nuclei, said system comprising:
   a writable microcode control store adapted to store micro-instructions;
   a readout circuit operatively coupled to read a sequence of micro-instructions from said microcode control store and to generate control signals in response to said micro-instructions;
   an RF transmitter controlled by said control signals, said RF transmitter generating a sequence of RF pulses in real time at specific timings such that said NMR sensitive nuclei within said body are stimulated to produce NMR responses;
   an RF receiver coupled to said body, said RF receiver receiving said NMR responses and producing responsive electrical signals;
   an imaging processor coupled to said RF receiver and programmed to generate image data in response to said electrical signals produced by said RF receiver; and
   a control store loading circuit operatively coupled to said control store, said loading circuit effecting loading of micro-instructions into said control store without significant interruption of said real time generation of said RF pulse sequence so as to avoid significant degradation of said image data that might arise due to Fourier transformation of signals resulting from disruption of said RF pulse sequence timing.

3. An MRI system as in claim 2 wherein said control store loading circuit continually reloads said microcode control store while said readout circuit reads from said control store.

4. An MRI system as in claim 2 wherein said system further includes access control means coupled to said control store for preventing said readout circuit and said loading circuit from simultaneously accessing said control store.

5. An MRI system as in claim 4 wherein said access control means includes priority means for granting said readout circuit priority access.

6. An MRI system as in claim 2 further including priority means for granting said readout circuit priority access to said control store.

7. An MRI system as in claim 2 wherein:
   said readout circuit has a minimum micro-instruction cycle time associated therewith; and
   said loading circuit loads micro-instructions into said control store in words smaller than one micro-instruction, and loads one such word into said control store within said minimum micro-instruction cycle time.

8. An MRI system as in claim 2 wherein:
   said system further comprises a host bus coupled to said loading circuit, said host bus carrying, during a write cycle, signals for loading into said control store; and
   said loading circuit includes means for extending the duration of said host bus write cycle in the event a write cycle occurs while said readout means is reading a micro-instruction from said control store.

9. An MRI system as in claim 2 wherein:
   said control store includes plural pages;
   said readout circuit includes addressing means for addressing a selected one of said plural pages; and
   said system further includes means, operatively coupled to said readout means and to said loading means, for detecting whenever said loading means attempts to load a micro-instruction into the same page said readout circuit addressing means is addressing.

10. An MRI system as in claim 2 wherein:
    said control store includes first and second memory pages;
    said readout circuit includes addressing means for addressing micro-instructions within an address space associated therewith, said address space having a first portion corresponding to said first memory page and a second portion corresponding to said second memory page; and
    said loading circuit loads micro-instructions into said first page during micro-instruction readout from said second page by said readout circuit, and loads micro-instructions into said second page during micro-instruction readout from said second page by said readout circuit.

11. A microcoded NMR pulse sequencer comprising:
    microcode control store means for storing micro-instructions of the type including instruction bits, control bits and state time duration bits;

control store accessing means coupled to said microcode control store means for accessing, in a sequence, said micro-instructions stored within said microcode control store means, said control store accessing means having a micro-instruction access cycle time duration associated therewith;

state time duration control means, operatively coupled to receive said state time duration bits of micro-instructions accessed by said control store accessing means, for timing the duration of sequencer states in response to said state time duration bits and for controlling said control store accessing means to access further micro-instructions so as to terminate said sequencer states in response to said sequencer state timing;

output control means, operatively coupled to receive said micro-instruction control bits accessed by said control store accessing means, for generating output states adapted for controlling generation of NMR pulse stimulations in real time, said output control means maintaining said output states for associated sequencer state time durations; and control store reloading means, operatively coupled to said control store, for writing micro-instructions into said control store during portions of said sequencer state time durations not corresponding to said micro-instruction access cycle time duration.

12. A sequencer as in claim 11 wherein:
said sequencer states are each bounded by a micro-instruction access cycle time; and
said control store reloading means writes at least a portion of a micro-instruction into said control store means after a certain micro-instruction access cycle time and before termination of a corresponding sequencer state associated with said certain micro-instruction access cycle time.

13. A sequencer as in claim 11 wherein said control store means includes plural memory pages, and said control store reloading means only writes to a page said control store access means is not currently accessing micro-instructions from.

14. A sequencer as in claim 11 wherein said control store means comprises exactly two memory pages, and said control store reloading means only writes to the one of said two pages said control store access means is not currently accessing micro-instructions from.

15. In a magnetic resonance imaging system, a method of reducing start-up latency due to microcoded NMR pulse sequencer initialization, said system comprising the following steps:
(a) writing microcode into less than all of a microcode control store;
(b) subsequent to performing said step (a), accessing microcode from said microcode control store with said sequencer and generating NMR pulse sequences in real time in response to said microcode; and
(c) subsequent to beginning said accessing step (b), writing further microcode into said microcode control store substantially without interrupting said NMR pulse sequences being generated by said step (b).

16. A method as in claim 15 further including the subsequent steps of:
(d) accessing said further microcode written by said step (c) from said microcode control store with said sequencer and generating NMR pulse sequences in real time in response to said further microcode; and
(e) subsequent to beginning said accessing step (d), loading new microcode control store in place of said microcode written by said step (a) substantially without interrupting said NMR pulse sequences being generated by said step (d).

17. A method of a microcoded NMR pulse sequencer of the type which controls the generation of RF pulses and magnetic gradient fields in real time response to microcode stored within a microcode control store so as to genera NMR responses, said method including the following steps:
reading a micro-instruction from said control store;
initiating a change to a new state in response to said micro-instruction read by said reading step;
changing a parameter relating to said generation of said RF pulses and/or magnetic gradient fields in real time response to said change to said new state;
determining, at least indirectly in response to said micro-instruction read by said reading step, when a change to a further new state is scheduled to occur; and
if said determining step reveals said change to said further new state is not scheduled to occur within a certain time period, writing further microcode into said control store.

18. A method as in claim 17 further including the step of postponing said writing step if said determining step reveals said change to said further new state is scheduled to occur within said certain time period.

19. A method as in claim 17 further including:
receiving, over a bus during a bus write cycle, microcode to be written by said writing step; and
extending said bus write cycle until after said certain time period if said determining step reveals said change to said further new state is scheduled to occur within said certain time period.

20. An NMR pulse sequencer of the type having loadable microcode RAM, said sequencer comprising:
access means coupled to said microcode RAM for reading microcode from said microcode RAM and for providing NMR pulse generation output signals in real time response thereto; and
reloading means also coupled to said microcode RAM for continually rewriting microcode stored by said microcode RAM substantially without interrupting the operation of said access means.

21. An NMR pulse sequencer as in claim 20 wherein said reloading means is adapted to cooperate with a host computer.

* * * * *